(12) United States Patent
Seo et al.

(10) Patent No.: US 7,733,441 B2
(45) Date of Patent: Jun. 8, 2010

(54) ORGANIC ELECTROLUMINESCENT LIGHTING SYSTEM PROVIDED WITH AN INSULATING LAYER CONTAINING FLUORESCENT MATERIAL

(75) Inventors: Satoshi Seo, Kanagawa (JP); Yasuyuki Arai, Kanagawa (JP)

(73) Assignee: Semiconductor Energy Labortory Co., Ltd., Atsugi-shi, Kanagawa-ken (JP)

( * ) Notice: Subject to any disclaimer, the term of this patent is extended or adjusted under 35 U.S.C. 154(b) by 326 days.

(21) Appl. No.: 11/139,673

(22) Filed: May 31, 2005

(65) Prior Publication Data

US 2005/0270464 A1 Dec. 8, 2005

(30) Foreign Application Priority Data

Jun. 3, 2004 (JP) ............................. 2004-166041

(51) Int. Cl.
*G02F 1/1335* (2006.01)
*H02J 1/62* (2006.01)
*H02J 63/04* (2006.01)

(52) U.S. Cl. ............................. 349/71; 349/69; 349/70; 313/491; 313/492; 313/501; 313/502; 313/506

(58) Field of Classification Search ............. 349/69–71; 313/501–509
See application file for complete search history.

(56) References Cited

U.S. PATENT DOCUMENTS

| 5,421,908 | A | 6/1995 | Yoshida et al. |
| 5,905,275 | A | 5/1999 | Nunoue et al. |
| 6,157,127 | A * | 12/2000 | Hosokawa et al. .......... 313/506 |
| 6,208,791 | B1 * | 3/2001 | Bischel et al. ............... 385/129 |
| 6,320,633 | B1 * | 11/2001 | Broer et al. .................. 349/113 |
| 6,479,941 | B1 * | 11/2002 | Abe et al. ................. 315/169.3 |
| 6,525,467 | B1 * | 2/2003 | Eida et al. .................... 313/506 |
| 6,608,449 | B2 | 8/2003 | Fukunaga |
| 6,853,011 | B2 | 2/2005 | Lin |
| 6,885,030 | B2 | 4/2005 | Onozuka et al. |
| 2003/0224571 | A1 | 12/2003 | Iijima et al. |
| 2004/0032202 | A1 | 2/2004 | Fukunaga |
| 2005/0258436 | A1 | 11/2005 | Arai |

FOREIGN PATENT DOCUMENTS

| JP | 06-342924 | 12/1994 |
| JP | 2004-134282 | 4/2004 |

\* cited by examiner

*Primary Examiner*—David Nelms
*Assistant Examiner*—Lauren Nguyen
(74) *Attorney, Agent, or Firm*—Fish & Richardson P.C.

(57) ABSTRACT

It is an object of the present invention to provide a lighting system having favorable luminance uniformity in a light-emitting region when the lighting system has large area. According to one feature of the invention, a lighting system comprises a first electrode, a second electrode, a layer containing a light-emitting substance formed between the first electrode and the second electrode, an insulating layer which is formed over a substrate in a grid form and contains a fluorescence substance, and a wiring formed over the insulating layer. The insulating layer and the wiring are covered with the first electrode so that the first electrode and the wiring are in contact with each other.

17 Claims, 16 Drawing Sheets

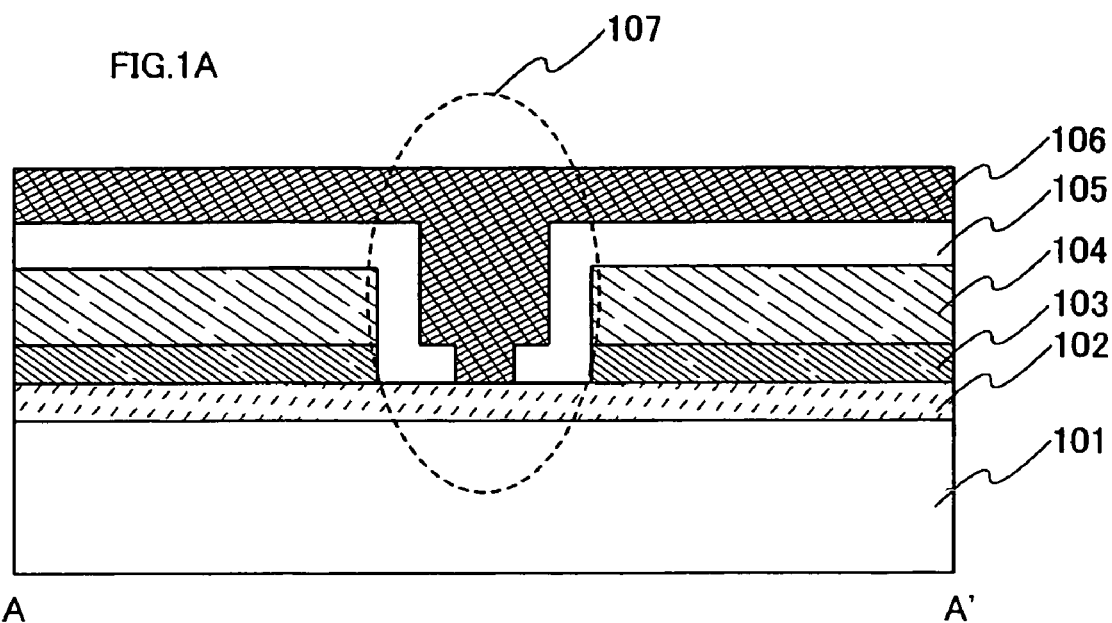
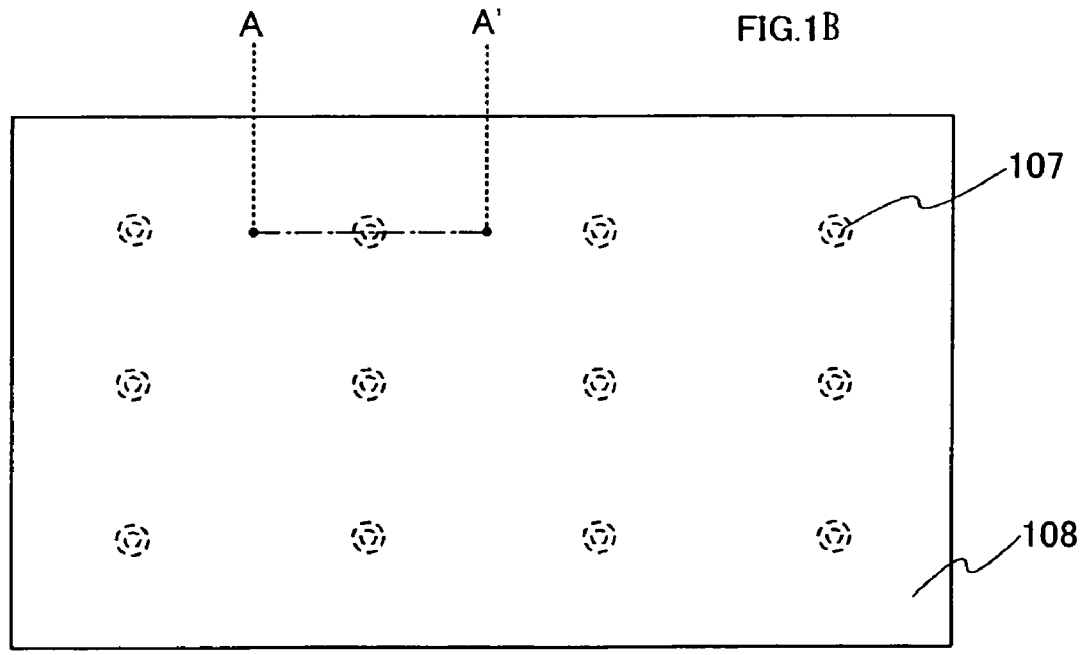

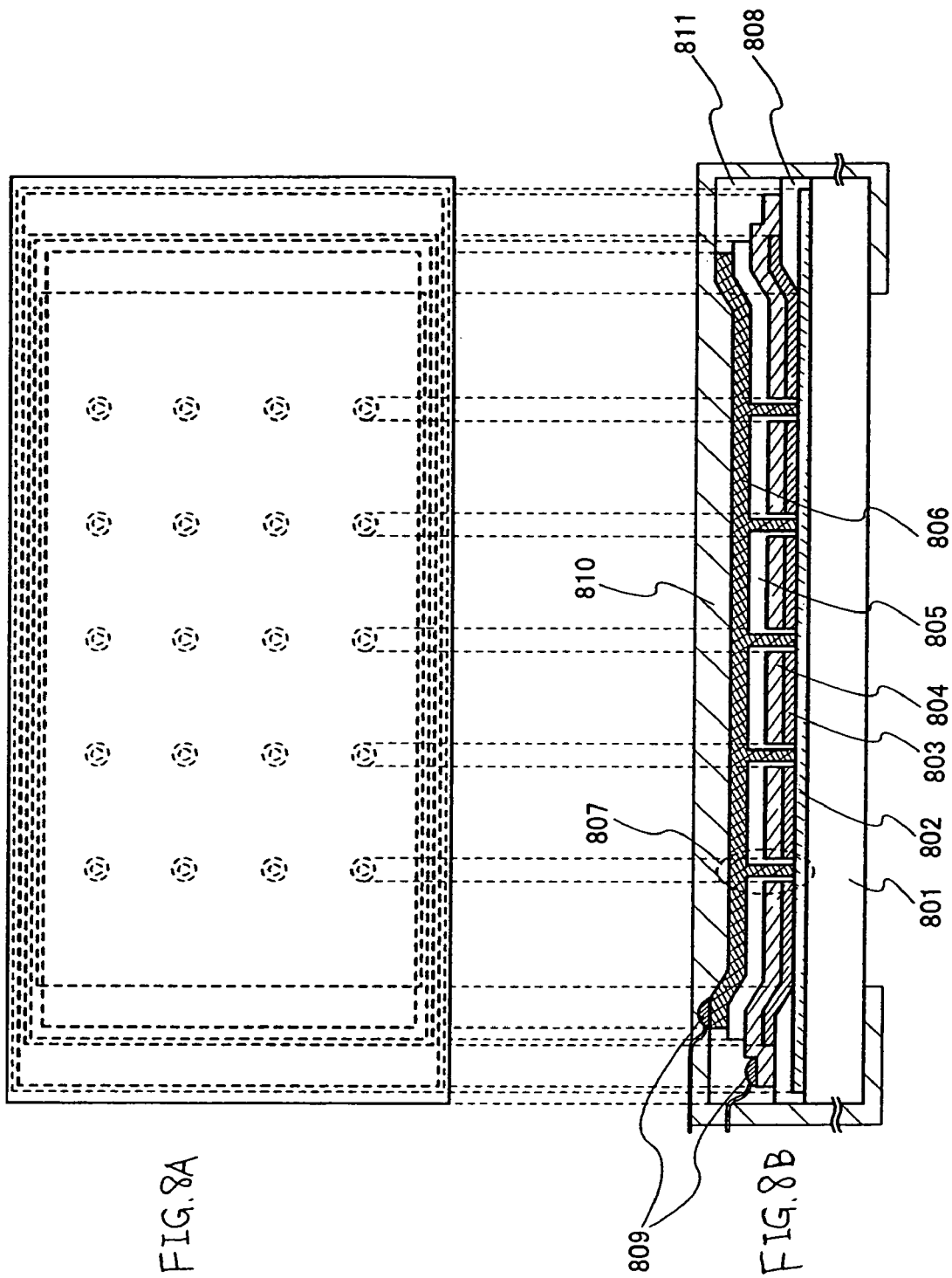

ORGANIC ELECTROLUMINESCENT LIGHTING SYSTEM PROVIDED WITH AN INSULATING LAYER CONTAINING FLUORESCENT MATERIAL

BACKGROUND OF THE INVENTION

1. Field of the Invention

This invention relates to a lighting system using a light-emitting element.

2. Description of the Related Art

A light-emitting element is a self light-emitting element and is attempted to be used as a lighting system. The light-emitting element is a surface-emitting body light, and a lighting system capable of emitting near-natural light can be obtained by using the light-emitting element for lighting.

The light-emitting element has a layer containing a light-emitting substance which provides luminescence (Electroluminescence) by applying an electric field thereto, an anode, and a cathode. A hole injected from the anode is combined with an electron injected from the cathode in the layer containing a light-emitting substance, thereby obtaining luminescence. Luminescence obtained from the layer containing a light-emitting substance includes luminescence (fluorescence) that is obtained in returning from a singlet-excited state to a ground state and luminescence (phosphorescence) that is obtained in returning from a triplet-excited state to a ground state.

In a light-emitting device using such a light-emitting element, an electrode in the direction of light emission needs to be transparent. However, a transparent conductive film which is typically used as a transparent electrode often has relatively high resistivity, and voltage drop is caused in a portion away from a current supply terminal. In particular, the lighting system often made to emit light from the entire surface at the same luminance; therefore, in-plane nonuniformity of luminance becomes further noticeable.

However, when the lighting system has large area, luminance is lowered in a portion through which current is hard to flow. In other words, luminance is nonuniform in a light-emitting region of the lighting system. In addition, an ITO electrode typically used as the anode has higher electrical resistivity than that of metal such as Al used as the cathode. Therefore, voltage drop is caused in a portion away from a current supply terminal, which results in low luminance. In order to solve the problem, Reference 1 reports a structure in which at least a portion of an anode is provided with an auxiliary electrode having lower electrical resistivity than that of the anode (see Reference 1: Japanese Patent Laid Open No. 2004-134282).

In Reference 1, an auxiliary electrode is provided on a long side or a short side of a light-emitting element. However, when the lighting system has large area, luminance is lowered in a part away from the auxiliary electrode (for example, in a central portion of the lighting system). However, since light emitted from a light-emitting layer cannot be extracted outside when the auxiliary electrode is entirely provided over the anode in the structure of Reference 1, the auxiliary electrode can only be partially provided.

Since the lighting system is often made to emit light from the entire surface at the same luminance, nonuniformity of the luminance becomes further noticeable.

SUMMARY OF THE INVENTION

In view of the above problem, it is an object of the invention to provide a lighting system having favorable luminance uniformity in a light-emitting region when the lighting system has large area.

According to one feature of a lighting system of the invention, a layer containing a light-emitting substance is formed between a first electrode and a second electrode, and a third electrode is formed to connect to the first electrode through an opening formed in the second electrode and the layer containing a light-emitting substance.

In other words, the lighting system has a layer containing a light-emitting substance and a second electrode between a first electrode and an auxiliary electrode; the auxiliary electrode is formed opposite to the first electrode with the second electrode therebetween; and the first electrode is electrically connected to the auxiliary electrode through an opening formed in the second electrode and the layer containing a light-emitting substance. Note that the first electrode and the second electrode need to be electrically insulated from the second electrode and the auxiliary electrode, respectively.

More specifically, according to another feature of the invention, a layer containing a light-emitting substance provided with a first opening and a second electrode provided with a second opening are arranged over a first electrode formed of a transparent conductive film so that the second opening overlaps the first opening; and an insulating layer formed over the second electrode, covering the first opening, the second opening, and the side of the second opening, and provided with a third opening to expose the first electrode and a third electrode formed over the insulating layer to be in contact with the first electrode through the first to third openings are formed.

According to another feature of the invention, a plurality of openings is formed in a light-emitting region of a lighting system.

In the above structure, light emitted from the layer containing a light-emitting substance is emitted from the first electrode side. In other words, the first electrode transmits light and is formed of a transparent conductive film. Specifically, indium tin oxide (hereinafter referred to as ITO), indium tin oxide containing silicon, indium oxide containing zinc oxide (ZnO) of 2% to 20%, or the like can be used.

Note that a material having low resistivity is preferably used as the auxiliary electrode. An effect of voltage drop due to relatively high resistivity of the first electrode can be reduced by using a material having low resistivity.

In the above structure, the layer containing a light-emitting substance may have a stacked structure of a plurality of layers each including a light-emitting substance.

Further in the above structure, a substrate for supporting the lighting system may be a flexible substrate.

In the above structure, no light is lost except in a connection portion of the auxiliary electrode and the first electrode because the auxiliary electrode is not placed in the direction of light emission. Therefore, a material, a thickness, or a formation position of the auxiliary electrode can be arbitrarily set.

In the case where the area of the connection portion of the auxiliary electrode and the first electrode is sufficiently small, the presence of the auxiliary electrode can be substantially disregarded even when seen from the side of light emission. Therefore, a plurality of openings can be formed in a light emitting region of the lighting system.

According to another feature of the invention, a lighting system comprises a first electrode, a second electrode, a layer containing a light-emitting substance formed between the first electrode and the second electrode, an insulating layer which is formed over a substrate in a grid form and contains a fluorescence substance, and a wiring formed over the insulating layer, in which the insulating layer and the wiring are covered with the first electrode so that the first electrode and the wiring are in contact with each other.

According to the invention, a lighting system having preferable in-plane uniformity of luminance can be obtained. Since an auxiliary electrode is not placed in the direction of light emission, little light is lost due to the auxiliary electrode, and a material, a thickness, or a formation position of the auxiliary electrode can be arbitrarily set.

BRIEF DESCRIPTION OF THE DRAWINGS

FIGS. 1A and 1B are each a cross-sectional view and a top view of a light-emitting region in a lighting system according to a certain aspect of the present invention;

FIGS. 8A and 8B are each a top view and a cross-sectional view of a lighting system according to a certain aspect of the present invention;

DETAILED DESCRIPTION OF THE INVENTION

Embodiment Mode of the present invention will be described in detail with reference to the accompanying drawings. However, the invention is not limited to the following description. As is easily known to a person skilled in the art, the mode and the detail of the invention can be variously changed without departing from the purpose and the scope of the invention. Thus, the invention is not interpreted while limiting to the following description of the embodiment modes.

Embodiment Mode 1

A structure of a lighting system according to the present invention is described with reference to FIGS. 1A and 1B. The lighting system illustrated in FIGS. 1A and 1B is a bottom emission lighting system which emits light from a substrate side. Note that FIG. 1B is a top view of a light-emitting region in a lighting system of the invention and FIG. 1A is a cross-sectional view (taken along line A-A' in FIG. 1B) in vicinity of an opening in the light-emitting region.

In FIGS. 1A and 1B, a light-transmitting substrate is used as a substrate 101. Specifically, a light-transmitting material such as glass, plastic, polyester, or an acryl resin can be used. The substrate 101 may be flexible.

A transparent conductive film is formed over the substrate 101 as a first electrode 102. For example, indium tin oxide (hereinafter referred to as ITO), indium tin oxide containing silicon, indium oxide containing zinc oxide (ZnO) of 2% to 20%, or the like can be used for the transparent conductive film.

Figure 11:
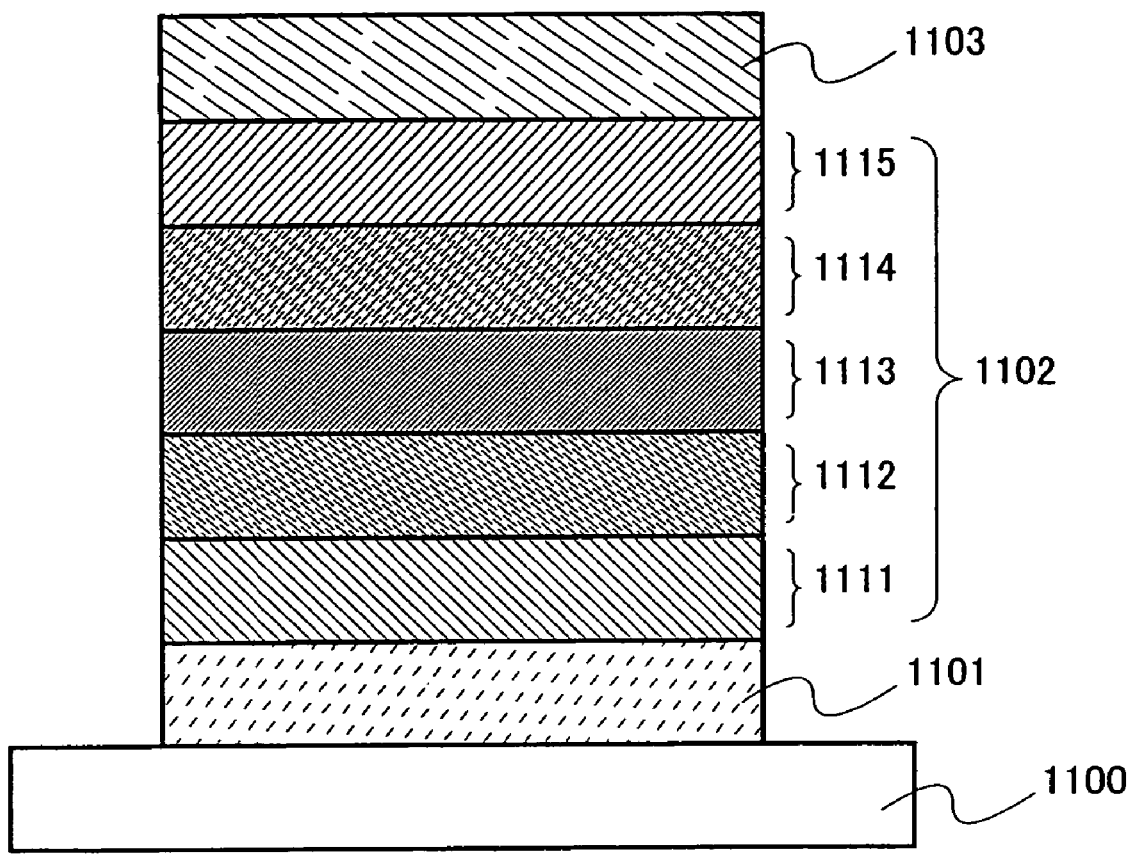
FIG. 11 illustrates an example of a layer containing a light-emitting substance of a lighting system according to a certain aspect of the present invention.

A layer containing a light-emitting substance 103 is formed over the first electrode 102. The layer containing a light-emitting substance 103 can be formed using a known material, and either a low molecular weight material or a high molecular weight material can also be used. A material to form the layer containing a light-emitting substance may include not only the one formed of only an organic compound material but also the one partially containing an inorganic compound. The layer containing a light-emitting substance is formed by appropriately combining a hole injecting layer, a hole transporting layer, a hole blocking layer, a light-emitting layer, an electron transporting layer, an electron injecting layer, or the like. The layer containing a light-emitting substance may be a single layer or have a stucked structure of a plurality of layers. FIG. 11 illustrates an example of a structure in which the layer containing a light-emitting substance includes a hole injecting layer, a hole transporting layer, a light-emitting layer, an electron transporting layer, and an electron injecting layer. In FIG. 11, a first electrode (anode) 1101, a layer containing a light-emitting substance 1102, and a second electrode (cathode) 1103 are formed over a substrate 1100. The layer containing a light-emitting substance 1102 includes a hole injecting layer 1111, a hole transporting layer 1112, a light-emitting layer 1113, an electron transporting layer 1114, and an electron injecting layer 1115. Note that the layer containing a light-emitting substance in a lighting system of the invention is not limited to the structure of FIG. 11. Hereinafter describes specific materials used for the hole injecting layer, the hole transporting layer, the light-emitting layer, the electron transporting layer, and the electron injecting layer.

A porphyrin-based compound is effective among other organic compounds as a material having hole injectability for forming the hole injecting layer, and phthalocyanine (hereinafter referred to as $H_2$-Pc), copper phthalocyanine (hereinafter referred to as Cu-Pc), or the like can be used. In addition, a chemically doped high molecular weight conductive compound can be used, such as polyethylene dioxythiophene (hereinafter referred to as PEDOT) doped with polystyrene sulfonate (hereinafter referred to as PSS). A benzoxazole derivative and any one or more of TCQn, FeCl$_3$, C$_{60}$, and F$_4$TCNQ may be included.

An aromatic amine based compound (in other words, an compound having a benzene ring-nitrogen bond) is preferably used as a material having hole transportability for forming the hole transporting layer. The following can be given as an example of materials that are widely used: N,N'-bis(3-methylphenyl)-N,N'-diphenyl-[1,1'-biphenyl]-4,4'-diamine (hereinafter referred to as TPD), a derivative thereof such as 4,4'-bis[N-(1-naphthyl)-N-phenyl-amino]-biphenyl (hereinafter referred to as α-NPD), or a star burst aromatic amine compound such as 4,4',4"-tris(N-carbazolyl)-triphenylamine (hereinafter referred to as TCTA), 4,4',4"-tris(N,N-diphenyl-amino)-triphenylamine (hereinafter referred to as TDATA) or 4,4',4"-tris[N-(3-methylphenyl)-N-phenyl-amino]-triphenyl-lamine (referred to as MTDATA).

Various fluorescent pigments are specifically effective as a light-emitting material for forming the light-emitting layer in addition to the following metal complex: tris(8-quinolino-lato)aluminum (hereinafter referred to as Alq$_3$), tris(4-methyl-8-quinolinolato)aluminum (hereinafter referred to as Almq$_3$), bis(10-hydroxybenzo[h]-quinolinato)beryllium (hereinafter referred to as BeBq$_2$), bis(2-methyl-8-quinolinato)(4-phenylphenolato)aluminum (hereinafter referred to as BAlq), bis[2-(2-hydroxyphenyl)-benzooxazolate]zinc (hereinafter referred to as Zn(BOX)$_2$), bis[2-(2-hydroxyphenyl)-benzothiazolate]zinc (hereinafter referred to as Zn(BTZ)$_2$), or the like.

In the case of forming the light-emitting layer in combination with a guest material, the following material can be used as the guest material: quinacridon, diethyl quinacridon (hereinafter referred to as DEQD), dimethyl quinacridon (hereinafter referred to as DMQD), rubrene, perylene, coumarin, coumarin545T (hereinafter referred to as C545T), DPT, Co-6, PMDFB, BTX, ABIX, DCM, DCJT, or a triplet light-emitting material (phosphorescence material) such as tris(2-phenylpyridine)iridium (hereinafter referred to as Ir(ppy)$_3$), or 2,3,7,8,12,13,17,18-octaethyl-21H,23H-porphyrin-platinum (hereinafter referred to as PtOEP).

The following material can be used as a material having electron transportability that can be used for the electron transporting layer:2-(4-biphenylyl)-5-(4-tert-buthylphenyl)-1,3,4-oxadiazole (abbreviated to PBD), 1,3-bis[5-(p-tert-buthylphenyl)-1,3,4-oxadiazole-2-yl]benzene (abbreviated to OXD-7), 3-(4-tert-buthylphenyl)-4-phenyl-5-(4-biphenylyl)-1,2,4-triazole (abbreviated to TAZ), 3-(4-tert-buthylphenyl)-4-(4-ethylpheyl)-5-(4-biphenylyl)-1,2,4-triazole (abbreviated to p-EtTAZ), bathophenanthroline (abbreviated to BPhen), bathocuproin (abbreviated to BCP), or the like, in addition to the foregoing metal complex such as Alq$_3$, Almq$_3$, bis(2-methyl-8-quinolinato)(4-phenylphenolato)aluminum (abbreviated to BAlq), BeBq$_2$, Zn(BOX)$_2$, or Zn(BTZ)$_2$, or a metal complex such as tris(8-quinolinolato)gallium (abbreviated to Gaq$_3$) or bis(2-methyl-8-quinolinato)-4-phenylphe-nolate-gallium (abbreviated to BGaq).

Specifically, an ultrathin film of an insulating material, for example, halogenated alkali metal such as LiF or CsF, halogenated alkali earth metal such as CaF$_2$, alkali metal oxide such as Li$_2$O, or the like is often used as a material having electron injectability for forming the electron injecting layer. In addition, an alkali metal complex such as lithium acety-lacetonate (abbreviated to Li(acac)) or 8-quinolinato-lithium (abbreviated to Liq) is also effective. A benzoxazole derivative and any one or more of alkali metal, alkali earth metal, and transition metal may be included.

Figure 12:
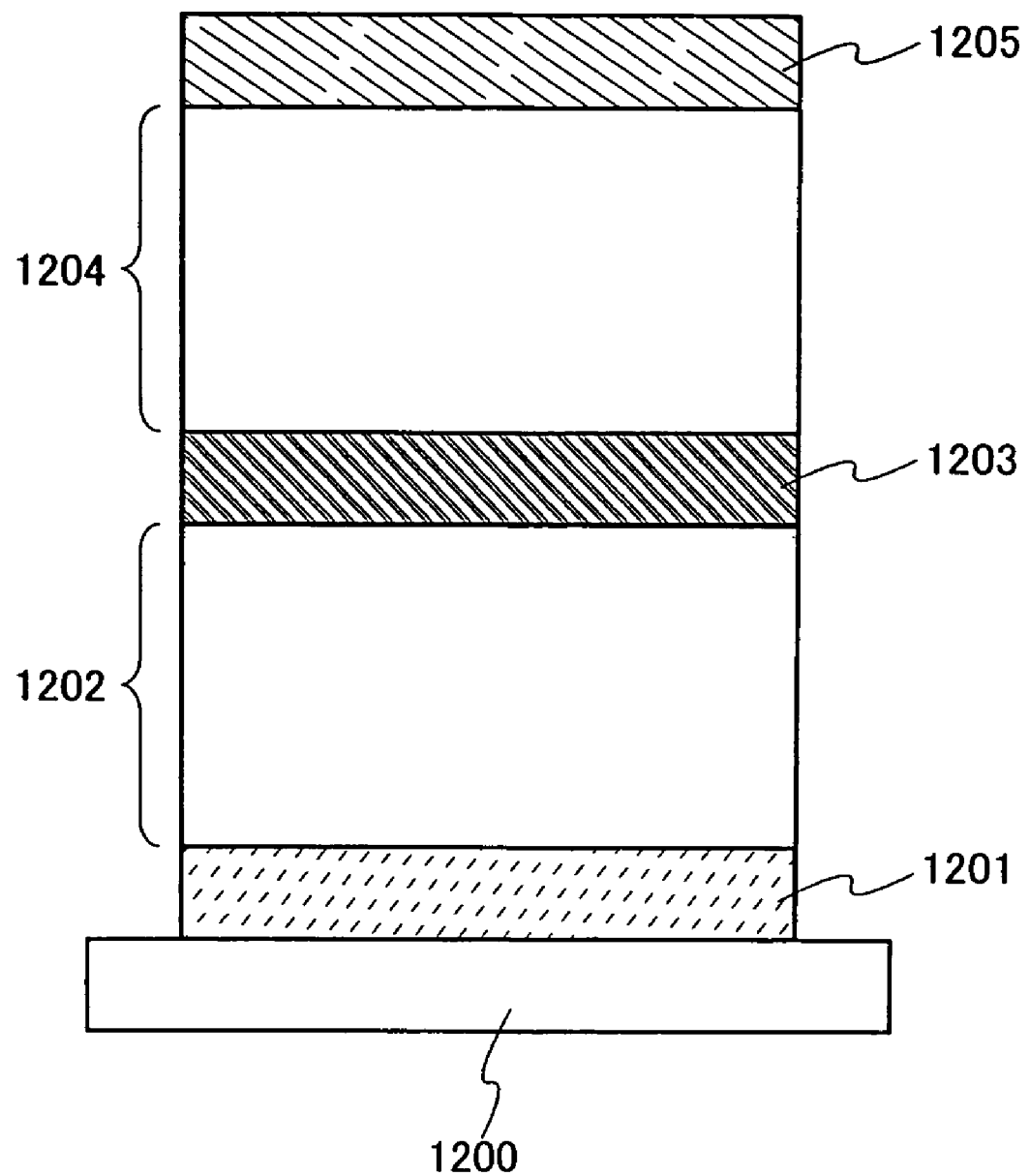
FIG. 12 illustrates an example of a layer containing a light-emitting substance of a lighting system according to a certain aspect of the present invention.

Note that the layer containing a light-emitting substance 103 may have a stacked structure of a plurality of layers each containing a light-emitting substance. FIG. 12 illustrates an example of a stacked structure of a plurality of layers each containing a light-emitting substance. FIG. 12 illustrates a structure in which a first electrode 1201, a first layer containing a light-emitting substance 1202, a charge generating layer 1203, a second layer containing a light-emitting substance 1204, and a second electrode 1205 are stacked over a substrate 1200. The charge generating layer 1203 needs to be formed of a highly light-transmitting material having a function of injecting a carrier. Although FIG. 12 illustrates a stacked structure of the two layers each containing a light-emitting substance, the structure of the layer containing a light-emitting substance 103 is not limited thereto, and a stacked structure of three or more layers each containing a light-emitting substance may be employed, too. In addition, the first electrode is used as the electrode on the substrate side in FIG. 12; however, the second electrode may be used as the electrode on the substrate side.

Luminance is enhanced by employing the stacked structure of layers each containing a light-emitting substance. The more layers are stacked, the more the luminance can be enhanced even with the same amount of current. In particular, a stacked structure of layers each containing a light-emitting substance is suitable for lighting use which requires high luminance. In the case of forming the stacked structure of a plurality of layers each containing a light-emitting substance, the layers each containing a light-emitting material may be formed of the same material or different materials.

For example, when layers each containing a light-emitting substance formed of materials which emit red (R), green (G), and blue (B) light may be stacked, white light emission can be obtained as a whole. The materials which emit red (R), green (G), and blue (B) light may each be formed by a vapor deposition method using a vapor-deposition mask, a droplet discharging method (also referred to as an ink-jet method), or the like. Specifically, CuPc or PEDOT can be used as the hole injecting layer; α-NPD, for the hole transporting layer; BCP or Alq$_3$, for the electron transporting layer; and BCP: Li or CaF$_2$, for the electron injecting layer, respectively. In addition, the light-emitting layer may be formed using Alq$_3$ doped with dopant (DCM or the like in the case of R or DMQD or the like in the case of G) corresponding to each light emission of R, G, and B, for example. In the case of obtaining white light emission, not only the stacked structure of the light-emitting materials of three colors as mentioned above but also a stacked structure of light-emitting materials of two colors may be employed. For example, white light emission can also be obtained by stacking the materials which emit blue and yellow light.

Note that the structure of the layer containing a light-emitting substance is not limited to the above stacked structure. For example, the layer containing a light-emitting substance may be any one of a single layer type, a stacked layer type, and a mixed type without an interface between layers. In addition, a fluorescent material, a phosphorescent material, or a combined material thereof can be used. For example, a phosphorescent material can be used for the material which emits red (R) light, and a fluorescent material can be used for the materials which emit green (G) and blue (B) light. Further, any one of the following may be used: an organic material including a low molecular weight material, a high molecular weight material, and a middle molecular weight material; an inorganic material typified by molybdenum oxide superior in terms of electron injectability and the like; and a composite material of the organic material and the inorganic material.

The lighting system of the invention may be formed to provide not only white light but also desired-color light. In addition, a color filter and/or a color conversion layer may be separately provided.

A second electrode 104 is formed over the layer containing a light-emitting substance 103. A known material can be used for the second electrode 104. In the case of a cathode, the second electrode 104 is preferably formed using a conductive material having a low work function. Specifically, rare-earth metal such as Yb or Er in addition to alkali metal such as Li or Cs, alkali earth metal such as Mg, Ca, or Sr, or an alloy thereof (Mg: Ag, Al: Li, or the like) can be used to form the cathode. When an electron injecting layer formed of LiF, CsF, $CaF_2$, $Li_2O$, or the like is used, a conductive thin film of aluminum or the like can be used. In the case of an anode, the second electrode 104 is preferably formed using a conductive material having a high work function. Specifically, a stacked layer structure of a titanium nitride film and a film mainly containing aluminum; a three-layer structure of a titanium nitride film, a film mainly containing aluminum, and a titanium nitride film; or the like can be employed in addition to a single layer film of TiN, ZrN, Ti, W, Ni, Pt, Cr, or the like. Alternatively, a method for stacking a transparent conductive film over a reflective electrode of Ti, Al, or the like may also be employed.

An insulating film 105 is formed to cover the second electrode 104 and the layer containing a light-emitting substance 103. According to this insulating film 105, the first electrode 102 and the second electrode 104, and the second electrode 104 and an auxiliary electrode 106 are each electrically insulated. The insulating film 105 may have a function as a protective film for preventing transmission of a substance such as moisture or oxygen to be the cause of promoting deterioration of the layer containing a light-emitting substance.

The insulating film 105 partially has an opening 107, through which the first electrode 102 is electrically connected to the auxiliary electrode 106. A material having low resistivity is preferably used for the auxiliary electrode 106; specifically, a material such as aluminum, copper, or silver can be used. In addition, the diameter of the opening is set from 10 μm to 500 μm, preferably from 50 μm to 200 μm.

In addition, a light-emitting region 108 is provided with a plurality of the openings 107. Since the auxiliary electrode 106 is electrically connected to the first electrode 102 through this opening 107, an effect of voltage drop due to relatively high resistivity of the transparent conductive film can be reduced. In other words, since the auxiliary electrode 106 is electrically connected to the first electrode 102 through the plurality of openings 107 formed in the light-emitting region 108, the resistivity of the first electrode 102 can be lowered practically. This can reduce nonuniformity of luminance that a portion away from a current supply terminal is dark. When the size of the opening is sufficiently small, the presence of the auxiliary electrode can be substantially disregarded when the lighting system is seen from the side of light emission, in other words, from the side of the light-transmitting substrate. Since the auxiliary electrode is not placed in the direction of light emission, a material, a thickness, or a formation position of the auxiliary electrode can be arbitrarily set. Therefore, the auxiliary electrode can be formed selectively in a position where voltage tends to drop, or can be entirely formed over the light-emitting region of the lighting system.

Since the lighting system of the invention can reduce the nonuniformity of luminance due to voltage drop caused by the first electrode, a lighting system having favorable in-plane uniformity of luminance can be obtained. Specifically, the lighting system is preferably applied to a large-sized lighting system.

Embodiment Mode 2

Figure 5A:
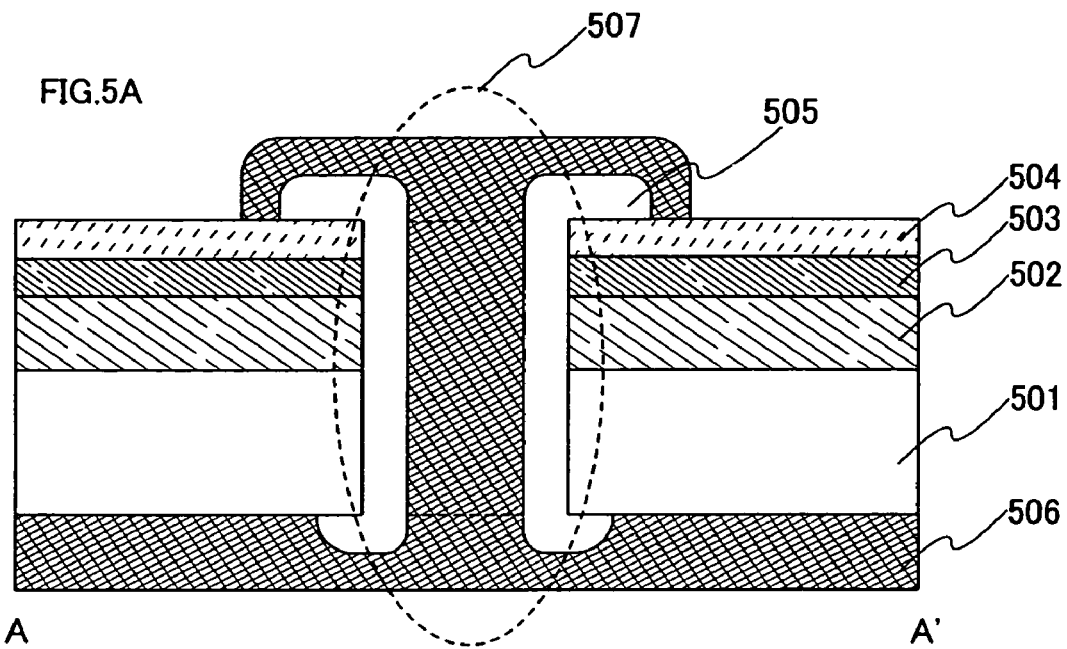
FIGS. 5A and 5B are each a cross-sectional view and a top view of a light-emitting region in a lighting system according to a certain aspect of the present invention.
Figure 5B:
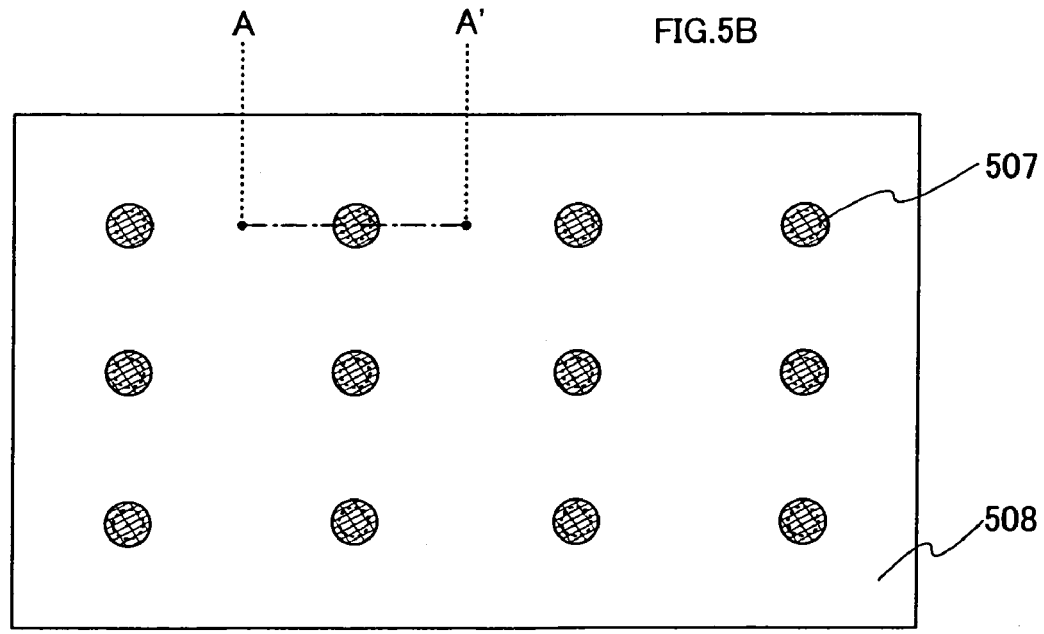

A structure of a lighting system according to the present invention is described with reference to FIGS. 5A and 5B. A lighting system illustrated in FIGS. 5A and 5B is a top emission lighting system in which light is emitted from the opposite side of a substrate side. Note that FIG. 5B is a top view of a light-emitting region of the lighting system and FIG. 5A is a cross-sectional view (taken along line A-A' in FIG. 5B) in vicinity of an opening in the light-emitting region.

In FIGS. 5A and 5B, a thin substrate formed of a flexile material is used as a substrate 501. Specifically, a flexible substrate such as a plastic substrate, a polyester film, or an acrylic resin film can be used.

A second electrode 502 is formed over the substrate 501. A known material can be used for the second electrode 502. In the case of a cathode, the second electrode 502 is preferably formed using a conductive material having a low work function. Specifically, rare-earth metal such as Yb or Er in addition to alkali metal such as Li or Cs, alkali earth metal such as Mg, Ca, or Sr, or an alloy thereof (Mg:Ag, Al:Li, or the like) can be used. When the electron injecting layer of LiF, CsF, $CaF_2$, $Li_2O$, or the like is used, a conductive thin film of aluminum can be used. In the case of an anode, the second electrode 502 is preferably formed using a conductive material having a high work function. Specifically, a stacked layer structure of a titanium nitride film and a film mainly containing aluminum; a three-layer structure of a titanium nitride film, a film mainly containing aluminum, and a titanium nitride film; or the like can be employed in addition to a single layer film of TiN, ZrN, Ti, W, Ni, Pt, Cr, or the like. Alternatively, a method for stacking a transparent conductive film over a reflective electrode such as Ti or Al may also be employed.

A layer containing a light-emitting substance 503 is formed over the second electrode 502. The layer containing a light-emitting substance 503 can be formed using a known material and either a low molecular weight material or a high molecular weight material can be used. A material for forming the layer containing a light-emitting substance includes not only an organic compound material but also a material partially containing an inorganic compound. In addition, the layer containing a light-emitting substance is formed by appropriately combining a hole injecting layer, a hole transporting layer, a hole blocking layer, a light-emitting layer, an electron transporting layer, an electron injecting layer, or the like; however, the layer containing a light-emitting substance may be formed in a single layer or may be formed by stacking a plurality of layers.

The layer containing a light-emitting substance 503 may have a stacked structure of a plurality of layers each containing a light-emitting substance. Luminance is enhanced by employing the stacked structure of layers each containing a light-emitting material. The more layers are stacked, the more the luminance can be enhanced even with the same amount of current. In particular, the stacked structure of layers each containing a light-emitting substance is suitable for lighting use which requires high luminance. In the case of forming the stacked structure of a plurality of layers each containing a light-emitting substance, the layers each containing a light-emitting substance may be formed of the same material or different materials.

A transparent conductive film is formed over the layer containing a light-emitting substance 503 as a first electrode

504. For example, indium tin oxide (hereinafter referred to as ITO), indium tin oxide containing silicon, indium oxide containing zinc oxide (ZnO) of 2% to 20%, or the like can be used for the transparent conductive film.

The substrate 501, the second electrode 502, the layer containing a light-emitting substance 503, and the first electrode 504 have an opening 507, and an insulating film 505 is formed to cover the vicinity of the opening of the first electrode 504 and the substrate 501 and the sidewall of the opening. According to this insulating film 505, the first electrode 504 and the second electrode 502, and the second electrode 502 and an auxiliary electrode 506 are each electrically insulated. The insulating film 505 may have a function as a protective film for preventing transmission of a substance such as moisture or oxygen to be the cause of promoting deterioration of the layer containing a light-emitting substance.

The auxiliary electrode 506 is formed over a lower surface of the substrate, in the opening, and in the vicinity of the opening of the first electrode, and is electrically connected to the first electrode in the vicinity of the opening. A material having low resistivity is preferably used for the auxiliary electrode 106; specifically, a material such as aluminum, copper, or silver can be used. In addition, the diameter of the opening is set from 10 μm to 500 μm, preferably from 50 μm to 200 μm.

In addition, a light-emitting region 508 is provided with a plurality of the openings 507. Since the auxiliary electrode 506 is electrically connected to the first electrode 504 through the opening 507, an effect of voltage drop due to relatively high resistivity of the transparent conductive film can be reduced. In other words, since the auxiliary electrode 506 is electrically connected to the first electrode 504 through the plurality of openings 507 formed in the light-emitting region 508, the resistivity of the first electrode 504 can be lowered practically. This can reduce nonuniformity of luminance that a portion away from a current supply terminal is dark. When the size of the opening is sufficiently small, the presence of the auxiliary electrode can be substantially disregarded when the lighting system is seen from the side of light emission, in other words, from the side of a light-transmitting substrate. Since the auxiliary electrode is not placed in the direction of light emission, a material, a thickness, or a formation position of the auxiliary electrode can be arbitrarily set. Therefore, the auxiliary electrode can be formed selectively in a position where voltage tends to drop, or can be entirely formed over the light-emitting region of the lighting system.

Since the lighting system of the invention can reduce in-plane nonuniformity of luminance which is caused by voltage drop due to relatively high resistivity of the first electrode, a lighting system having favorable in-plane uniformity of luminance can be obtained. Specifically, the lighting system is preferably applied to a large-sized lighting system.

Embodiment Mode 3

One mode of a lighting system according to the present invention is described with reference to FIGS. 13A and 13B. Note that FIG. 13A is a cross-sectional view of the lighting system illustrated in a top view of FIG. 13B taken along line A-A'.

Figure 13A:
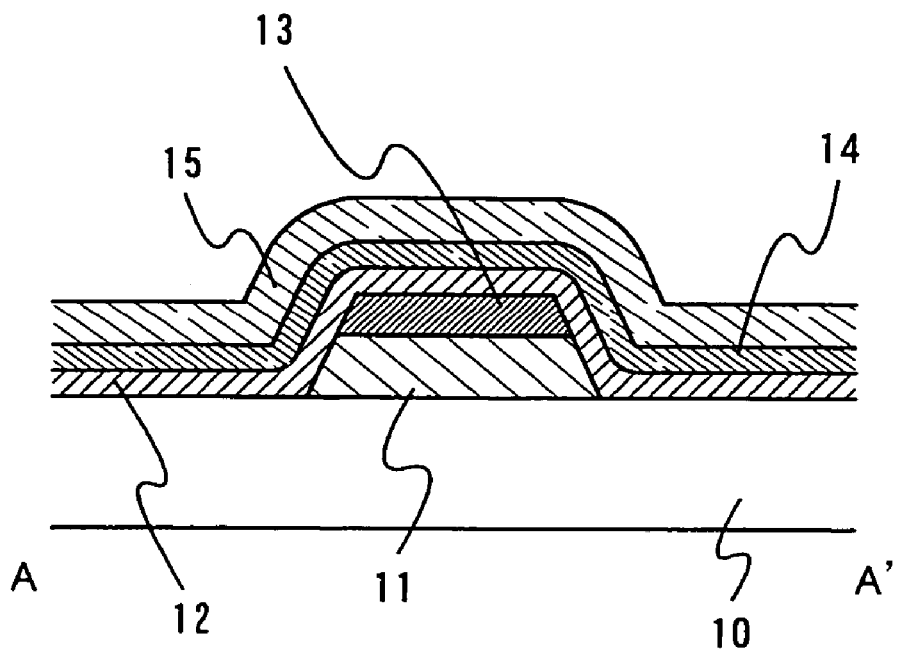
FIGS. 13A and 13B each explain a mode of a lighting system according to a certain aspect of the present invention.
Figure 13B:
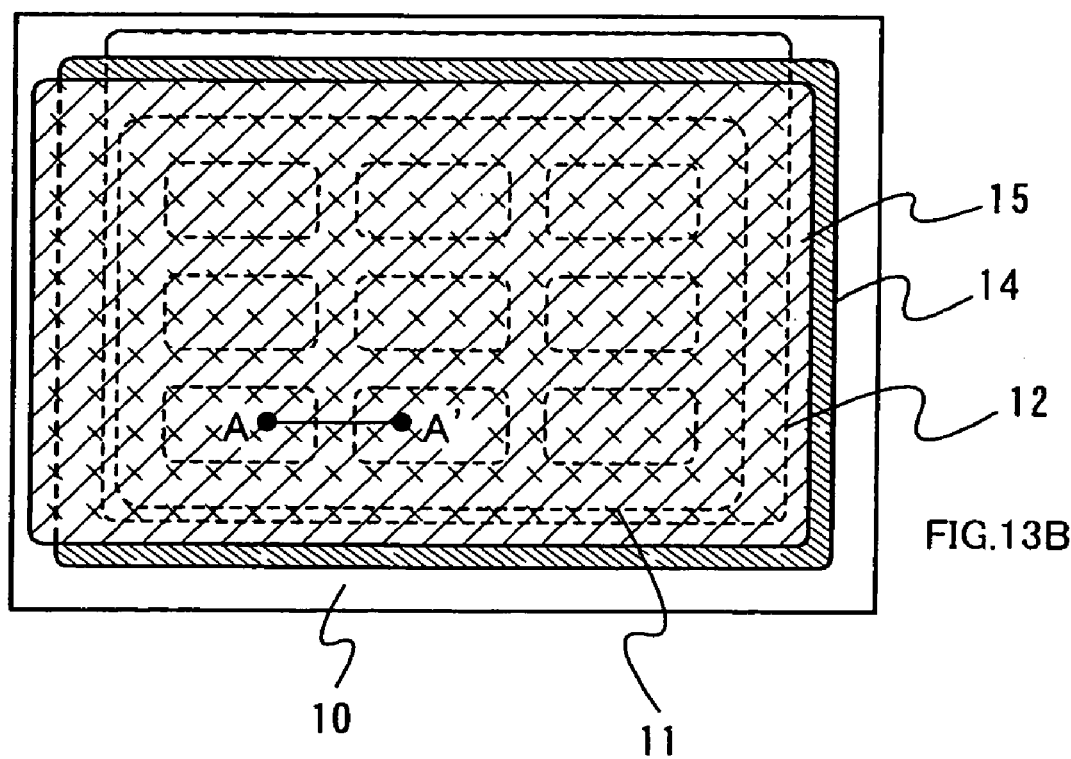

In FIGS. 13A and 13B, an insulating layer 11 is formed over a substrate 10. As shown in FIG. 13B, the insulating layer 11 is formed in a grid form over the substrate 10. In addition, the insulating layer 11 contains a fluorescent substance. Then, a wiring 13 is formed over the insulating layer 11.

A first electrode 12 is formed over the insulating layer 11 and the wiring 13 so that the insulating layer 11 and the wiring 13 are covered. Then, a layer containing a light-emitting substance 14 is formed over the first electrode 12. Further, a second electrode 15 is formed over the layer containing a light-emitting substance 14.

Here, the first electrode 12 is not limited particularly but preferable to be an electrode capable of transmitting visible light and the same electrode as the first electrode 102 described in Embodiment Mode 1 can be used. In addition, the second electrode 15 is also not limited particularly and the same electrode as the second electrode 104 described in Embodiment Mode 1 can be used. Further, the layer containing a light-emitting substance 14 is not limited particularly and the same layer as the layer containing a light-emitting substance 103 described in Embodiment Mode 1 can be used.

The wiring 13 is not limited particularly but preferably formed of metal having a small resistance such as aluminum or copper.

In addition, the fluorescent substance included in the insulating layer 11 is also not limited particularly and the following materials can be used: a polyaromatic compound such as 9,10-diphenylanthracene, 9,10-di-2-naphthylanthracene, 9,10-bis(4-diphenylaminophenyl)anthracene, rubrene, 1,2,3,4,5-pentaphenylcyclopentadiene, p-sexiphenyl, perylene, or 2,5,8,11-tetra-tert-butylperylene; a heteroaromatic compound such as 2,5-diphenyloxazole, 1,4-bis(5-phenyloxazole-2-yl)benzene, 1,4-bis(4-methyl-5-phenyloxazole-2-yl)benzene, 2-(1-naphtyl)-5-phenyloxazole, 2-(4-biphenylyl)-6-phenylbenzoxazole, 2,5-bis(5-tert-buthylbenzoxazole-2-yl)thiophene, 2-(4-biphenylyl)-6-phenylbenzoxazole, 2-(4-biphenylyl)-5-phyenyl-1,3,4-oxadiazole, 2-(4-tert-buthylphenyl)-5-(4-biphenylyl)-1,3,4-oxadiazole, 2,4-diphenyl-1,3,4-oxadiazole, or lophine; a coumarin-based compound such as coumarin6, coumarin6H, coumarin7, coumarin 30, coumarin102, coumarin120, coumarin115, coumarin152, coumarin153, coumarin314, coumarin334, coumarin337, coumarin343, coumarin480D, or coumarin545T; a pyran-based compound such as 4-(dicyanomethylene)-2-methyl-6-[2-(4-dimethylaminophenyl)ethenyl]-4H-pyran, 4-(dicyanomethylene)-2-methyl-6-[2-(julolidine-9-yl)ethenyl]-4H-pyran, 4-(dicyanomethylene)-2-methyl-6-[2-(2,2,7,7-tetramethyljulolidine-9-yl)ethenyl]-4H-pyran, 4-(dicyanomethylene)-2-tert-butyl-6-[2-(2,2,7,7-tetramethyljulolidine-9-yl)ethenyl]4H-pyran, or 4-(dicyanomethylene)-2-isopropyl-6-[2-(2,2,7,7-tetramethyljulolidine-9-yl)ethenyl]-4H-pyran; a styrene-based compound such as 1,1,4,4-tetraphenyl-1,3-butadiene, 1,4-bis(2-methylstyryl)benzene, or 4,4'-bis(2,2-diphenylethenyl)biphenyl; or a xanthene-based compound such as rhodamineB, rhodamine6G; rhodamine575, fluoresceine, or Nile Red.

Here, the surface height of the layer containing a light-emitting substance 14 (the height up to the surface of the layer containing a light-emitting substance 14 from a reference surface when a surface of the substrate 10, in other words, the substrate surface is regarded as the reference surface) is preferably lower than the surface height of the insulating layer 11. Accordingly, luminescence in the layer containing a light-emitting substance 14 enters the insulating layer 11 much easily.

Further, an insulating layer including silicon nitride or silicon oxide may be formed between the first electrode 12 and the substrate 10. Moisture which gets mixed by transmitting the substrate 10 can be prevented from penetrating the layer containing a light-emitting substance 14 by forming such an insulating layer.

A voltage drop in the first electrode 12 is decreased by providing the wiring 13 in the foregoing lighting system.

In addition, the lighting system having the foregoing structure emits light when the light-emitting substance, which is excited by recombining a hole injected from the first electrode 12 and an electron injected from the second electrode 15, returns to a ground state. Further, in the lighting system according to this embodiment mode, the luminescence with waveguide in the direction parallel to the substrate surface enters the insulating layer 11 and the fluorescent substance contained in the insulating layer 11 emits light.

In this manner, luminescence is obtained from the entire substrate surface of the substrate 10 by light emission from the fluorescent substance contained in the insulating layer 11.

Embodiment Mode 4

Figure 14A:
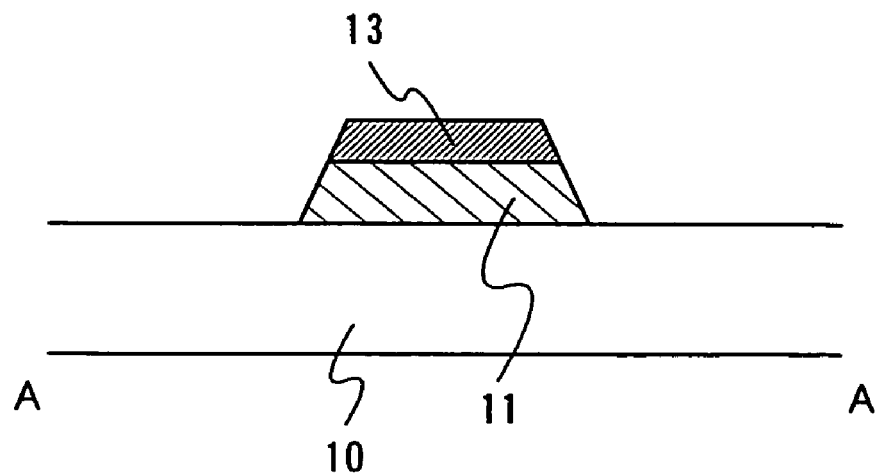
FIGS. 14A to 14C each explain a method for manufacturing a lighting system according to a certain aspect of the present invention.
Figure 14B:
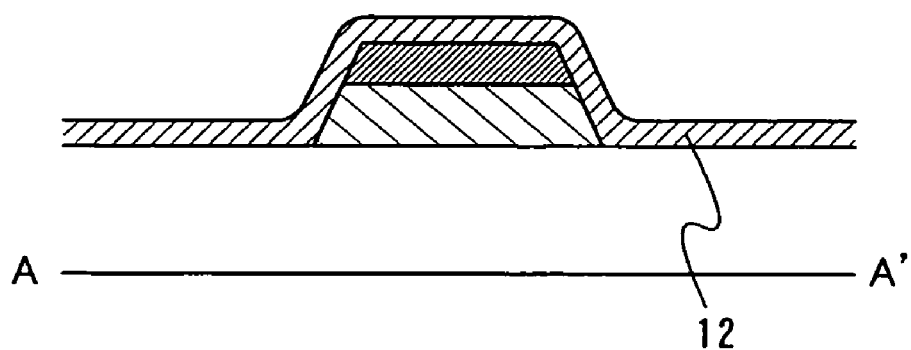
Figure 14C:
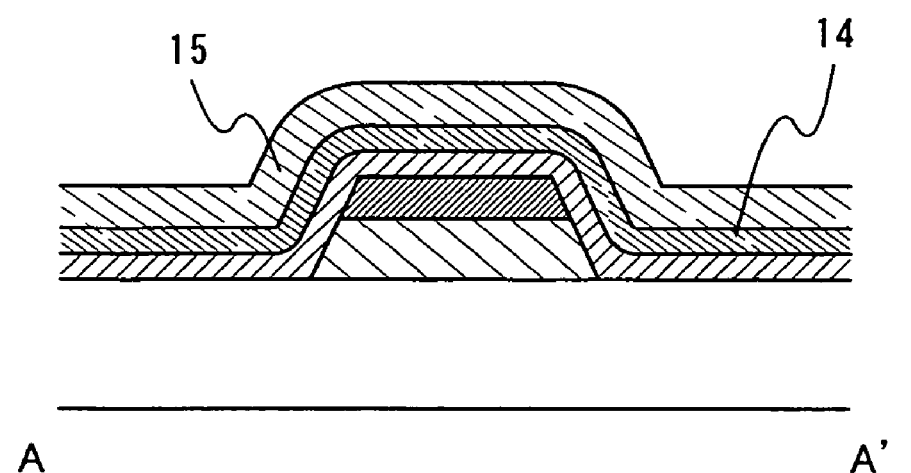

This embodiment mode describes a method for manufacturing the lighting system described in Embodiment Mode 3 with reference to FIGS. 14A to 14C and FIGS. 15A to 15C. Note that FIGS. 14A to 14C are cross-sectional views of the lighting system illustrated in top views of FIGS. 15A to 15C taken along line A-A', respectively.

First, after sequentially forming an insulating layer and a conductive layer over a substrate 10, the insulating layer and the conductive layer are processed into desired shapes to form an insulating layer 11 and a wiring 13. The insulating layer 11 is not limited particularly and an insulating layer containing a fluorescent substance may be used. Siloxane, acrylic or polyimide, or the like can be given as an example of such an insulating layer. In addition, the wiring 13 is not limited particularly but preferably formed using a material with low resistivity such as aluminum or copper. Further, the aluminum may contain nickel, silicon, or the like.

Then, a first electrode 12 is formed over the substrate 10, the insulating layer 11, and the wiring 13 so that the substrate 10, the insulating layer 11, and the wiring 13 are covered. The first electrode 12 is not limited particularly and preferably formed using the same material as the first electrode 102 described in Embodiment Mode 1. In addition, a method for manufacturing the first electrode 12 is not limited particularly and may be formed by using a sputtering method or the like.

Figure 15A:
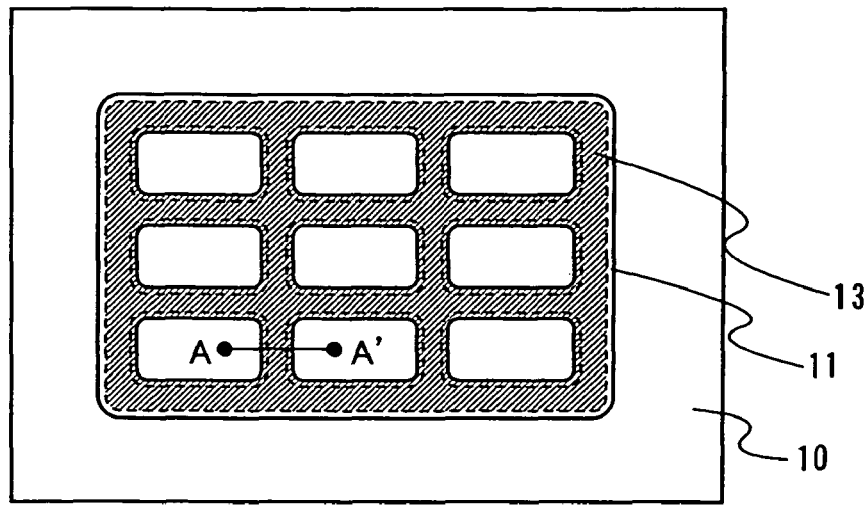
FIGS. 15A to 15C each explain a method for manufacturing a lighting system according to a certain aspect of the present invention.
Figure 15B:
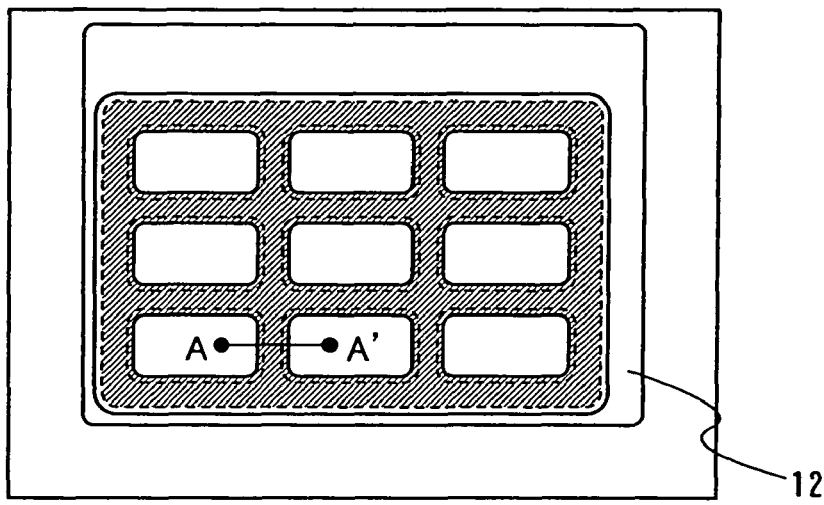
Figure 15C:
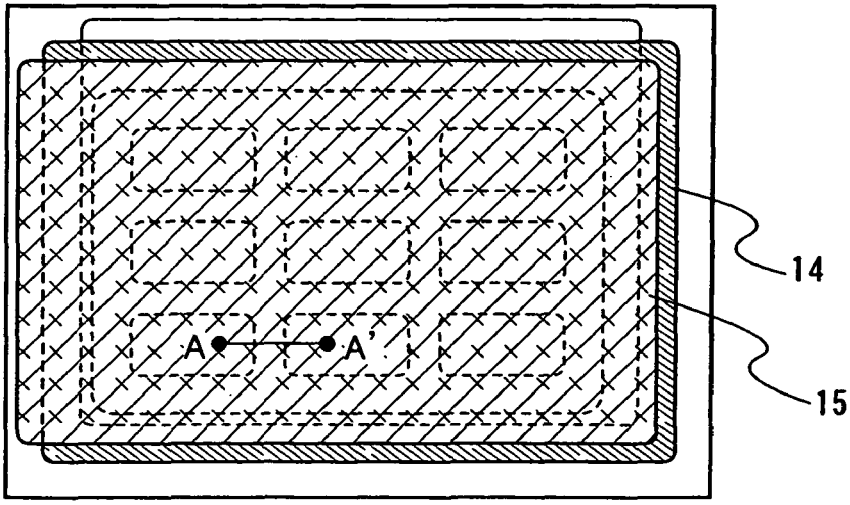

In this embodiment mode, the insulating layer 11 and the wiring 13 are processed by being etched continuously using the same resist mask. However, not limiting thereto, after forming the insulating layer 11 in a desired shape, the wiring 13 may be formed by forming the conductive layer that covers the insulating layer 11 and processing the conductive layer into a desired shape, for example. In this embodiment mode, the insulating layer 11 is formed in a grid form as illustrated in FIG. 15B.

Then, a layer containing a light-emitting substance 14 is formed so that the first electrode 12, the insulating layer 11, and the wiring 13 are covered. The layer containing a light-emitting substance 14 is not limited particularly and a layer having the same structure as the layer containing a light-emitting substance 103 described in Embodiment Mode 1 may be formed by using a vapor deposition method, an ink-jet method, or the like.

Thereafter, a second electrode 15 is formed over the layer containing a light-emitting substance 14. The second electrode 15 is not limited particularly and preferably formed using the same material as the second electrode 104 described in Embodiment Mode 1. In addition, a method for manufacturing the second electrode 15 is also not limited particularly and may be formed using a sputtering method, a vapor deposition method, or the like.

Further, it is preferable that the first electrode 12 and the second electrode 15 are stacked not to be in contact with each other. For example, the first electrode 12 and the second electrode 15 are formed so that one edge of both the electrodes is more inward than the layer containing a light-emitting substance 14. Therefore, the first electrode 12 and the second electrode 15 are prevented from being in contact with each other.

Embodiment Mode 5

One mode of a lighting system of the present invention is described with reference to FIGS. 16A and 16B. Note that FIG. 16A is a cross-sectional view of the lighting system illustrated in a top view of FIG. 16B taken along line A-A'.

Figure 16A:
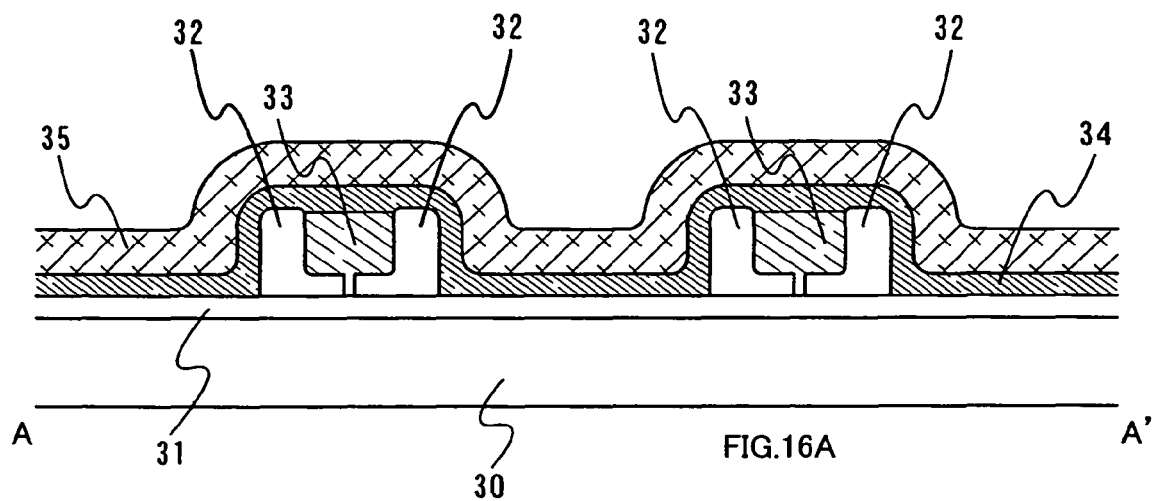
FIGS. 16A and 16B each explain a mode of a lighting system according to a certain aspect of the present invention.
Figure 16B:
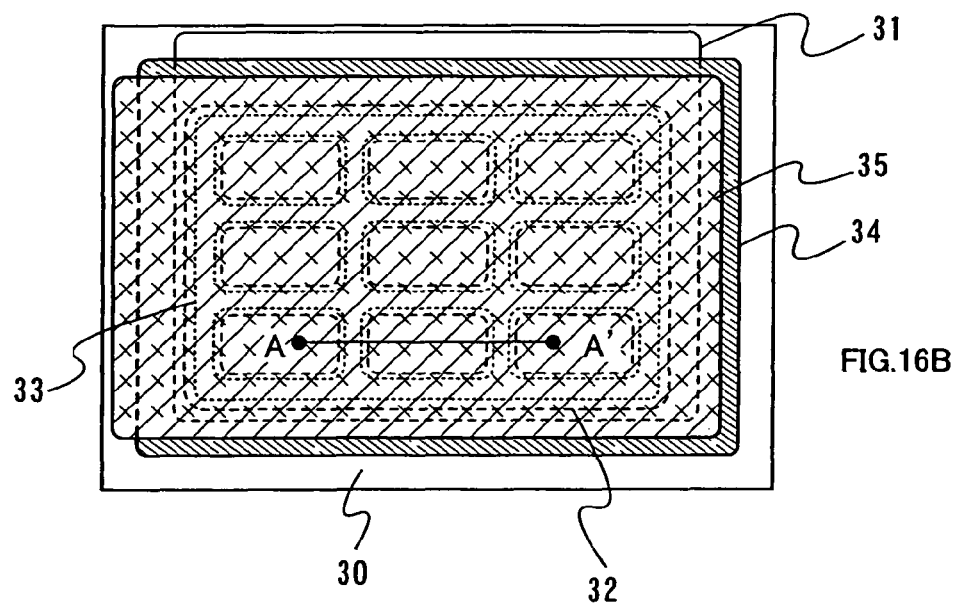

In FIGS. 16A and 16B, a first electrode 31 is formed over a substrate 30. An insulating layer 32 having a depression is formed over the first electrode 31. As shown in FIG. 16B, the insulating layer 32 is formed over the first electrode 31 in a grid form. In addition, the insulating layer 32 contains a fluorescent substance. Then, a wiring 33 is formed inside the depression of the insulating layer 32. Further, an opening is formed inside the depression of the insulating layer 32 and the wiring 33 is connected to the first electrode 31 through the opening.

The first electrode 31, the insulating layer 32, and the wiring 33 are covered with a layer containing a light-emitting substance 34. Further, a second electrode 35 is formed over the layer containing a light-emitting substance 34.

Here, the wiring 33 is not limited particularly but preferably formed of metal having a small resistance such as aluminum or copper.

Further, the surface height of the layer containing a light-emitting substance 34 is preferably lower than the surface height of the insulating layer 32.

In addition, the fluorescent substance is not limited particularly and the fluorescent substance or the like as described in Embodiment Mode 3 can be used.

The first electrode 31 is not limited particularly but preferable to be an electrode capable of transmitting visible light and the same electrode as the first electrode 102 described in Embodiment Mode 1 can be used. In addition, the second electrode 35 is also not limited particularly and the same electrode as the second electrode 104 described in Embodiment Mode 1 can be used. Further, the layer containing a light-emitting substance 34 is not limited particularly and the same layer as the layer containing a light-emitting substance 103 described in Embodiment Mode 1 can be used.

A voltage drop in the first electrode 31 is decreased by providing the wiring 33 in the foregoing lighting system.

In addition, the lighting system having the foregoing structure emits light when the light-emitting substance, which is excited by recombining a hole injected from the first electrode 31 and an electron injected from the second electrode 35, returns to a ground state. Further, in the lighting system according to this embodiment mode, the luminescence with waveguide in the direction parallel to the substrate surface enters the insulating layer 32 and the fluorescent substance contained in the insulating layer 32 emits light.

In this manner, luminescence is obtained from the entire substrate surface of the substrate 30 by light emission from the fluorescent substance contained in the insulating layer 32.

Embodiment 1

This embodiment describes a method for manufacturing the lighting system according to the present invention illustrated in FIGS. 1A and 1B with reference to FIGS. 2A to 2D.

A transparent conductive film, which is a first electrode 202, is formed over a light-transmitting substrate 201. In this embodiment, a glass substrate is used as the light-transmitting substrate 201 and ITO is formed as the first electrode 202.

Then, a layer containing a light-emitting substance 203 is formed over the first electrode 202. A known material can be used for the layer containing a light-emitting substance 203. The layer containing a light-emitting substance may have a stacked structure of a plurality of layers each containing a light-emitting substance.

Figure 2A:
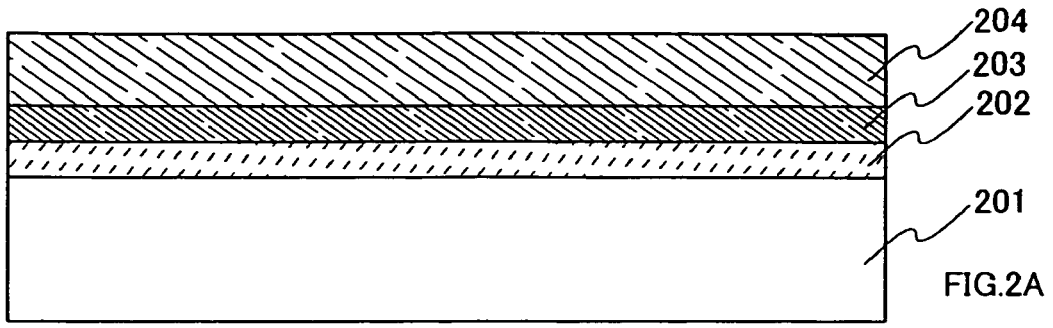
FIGS. 2A to 2D each illustrate a method for manufacturing a lighting system according to a certain aspect of the present invention.
Figure 2B:
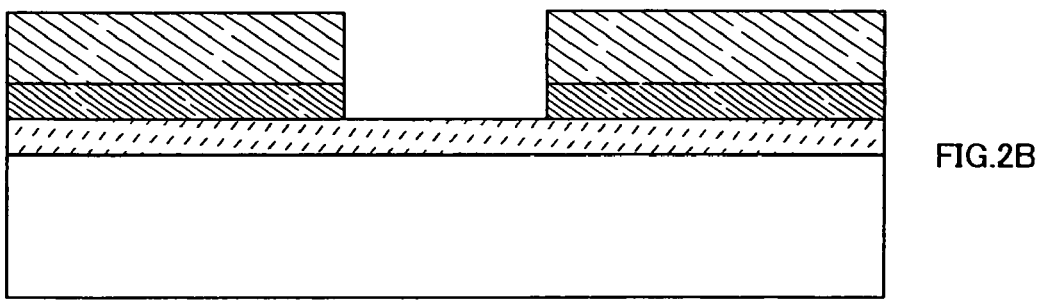

A second electrode 204 is formed over the layer containing a light-emitting substance 203 (FIG. 2A). The second electrode 204 has an opening. After the second electrode is entirely formed over the layer containing a light-emitting substance, the opening may be formed by patterning the second electrode by a photolithography method or may be formed using a mask. In this embodiment, aluminum is used as the second electrode 204. After the second electrode 204 is entirely formed over the layer containing a light-emitting substance 203, it is patterned by a photolithography method. Then, the opening is formed in the layer containing a light-emitting substance, using the patterned second electrode as a mask (FIG. 2B).

Figure 2C:
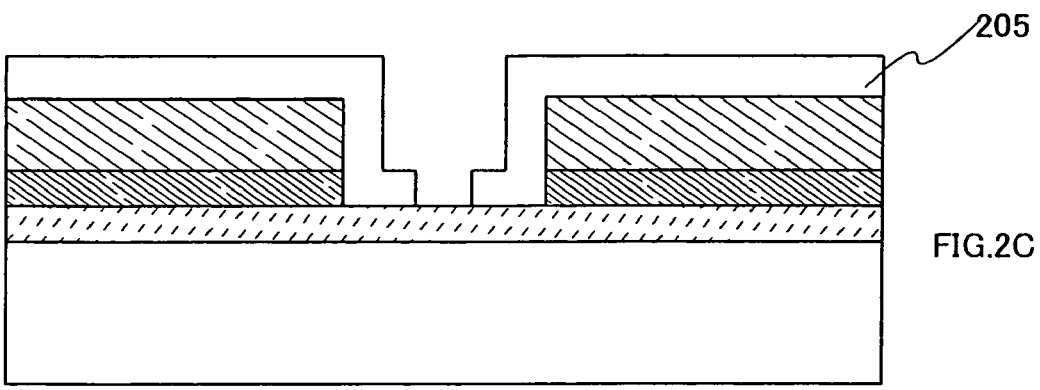

An insulating film 205 is formed to cover the layer containing a light-emitting substance 203 and the second electrode 204 (FIG. 2C). The insulating film 205 also has an opening. After the insulating film is entirely formed, the opening may be formed by patterning the insulating film by a photolithography method or may be formed using a mask. In this embodiment, silicon oxide is used for the insulating film 205.

Figure 2D:
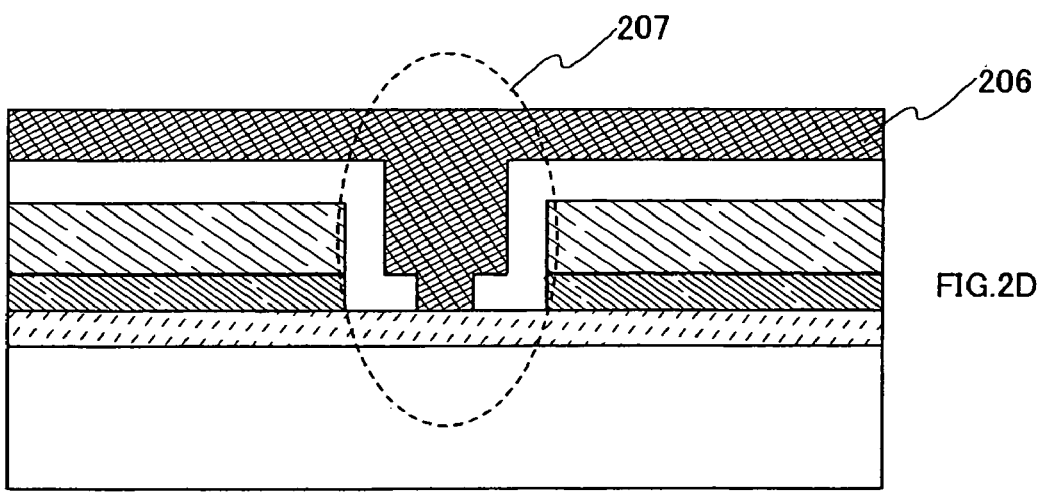

Thereafter, an auxiliary electrode 206 is formed (FIG. 2D). The auxiliary electrode 206 is desirable to have low resistivity and aluminum is used in this embodiment. The auxiliary electrode 206 is electrically connected to the first electrode 202 through an opening 207 and insulated from the second electrode 204.

In this manner, ITO, which is the first electrode 202, is connected to the auxiliary electrode 206 through the opening 207, and an effect of voltage drop due to relatively high resistivity of the first electrode can be reduced. Therefore, in-plane inhomegeneity of luminance can be reduced when the lighting system is applied to a large-sized lighting system. In the case where the opening 207 is sufficiently small, the presence of the auxiliary electrode can be substantially disregarded when the lighting system is seen from the side of light emission, in other words, from the side of the light transmitting substrate.

In this embodiment, although the layer containing a light-emitting substance is patterned using aluminum as a mask after being entirely formed, the layer containing a light-emitting substance may be formed using a mask to have an opening.

Figure 3A:
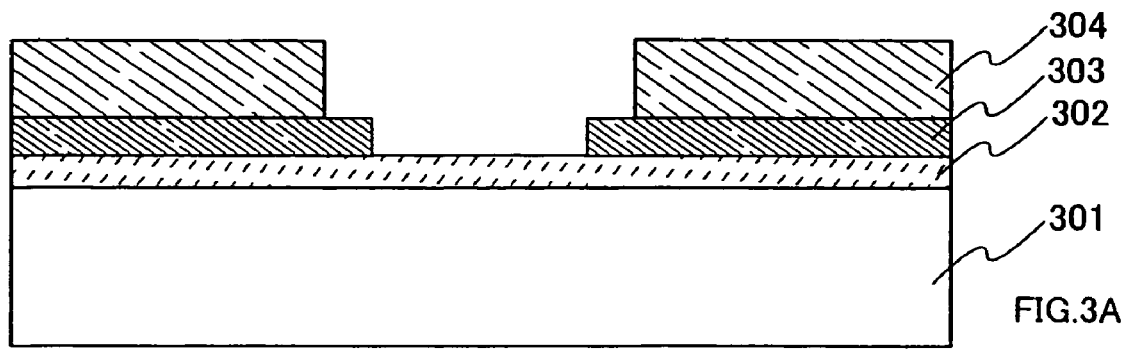
FIGS. 3A to 3C each illustrate a method for manufacturing a lighting system according to a certain aspect of the present invention.
Figure 3B:
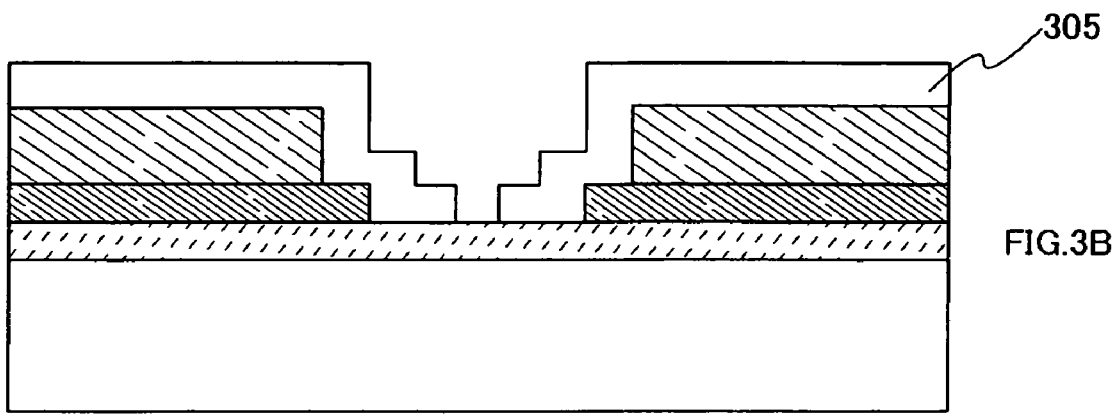
Figure 3C:
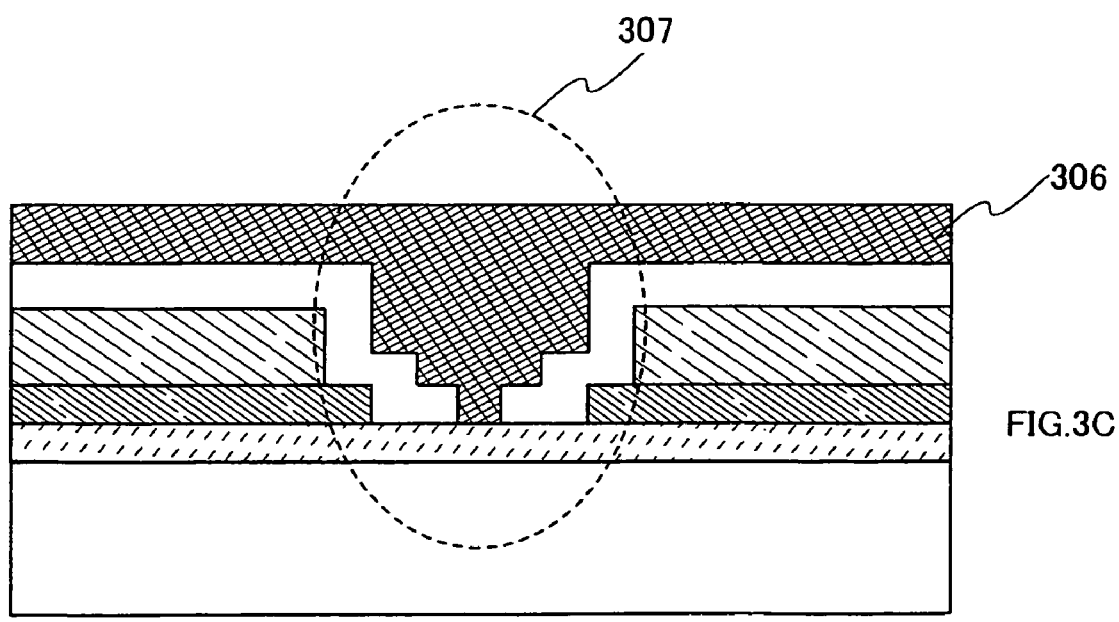

In addition, FIGS. 3A to 3C illustrate a method for forming each of a layer containing a light-emitting substance 303 and a second electrode 304 using a mask. In other words, each of the layer containing a light-emitting substance 303 and a second electrode 304 is formed using a mask after entirely forming a first electrode 302. An insulating film 305, an auxiliary electrode 306, and an opening 307 may be formed in the same manner as the foregoing method. At this time, the first electrode is more certainly insulated from the second electrode by making the opening of the second electrode 304 larger than that of the layer containing a light-emitting substance 303.

Embodiment 2

Figure 4A:
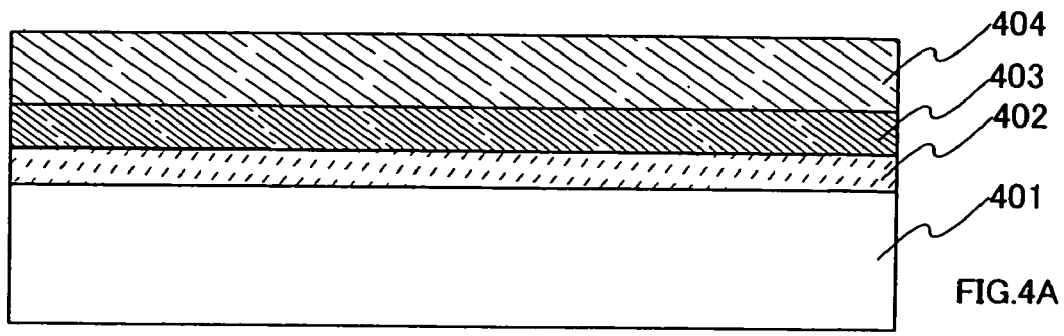
FIGS. 4A to 4C each illustrate a method for manufacturing a lighting system according to a certain aspect of the present invention.
Figure 4B:
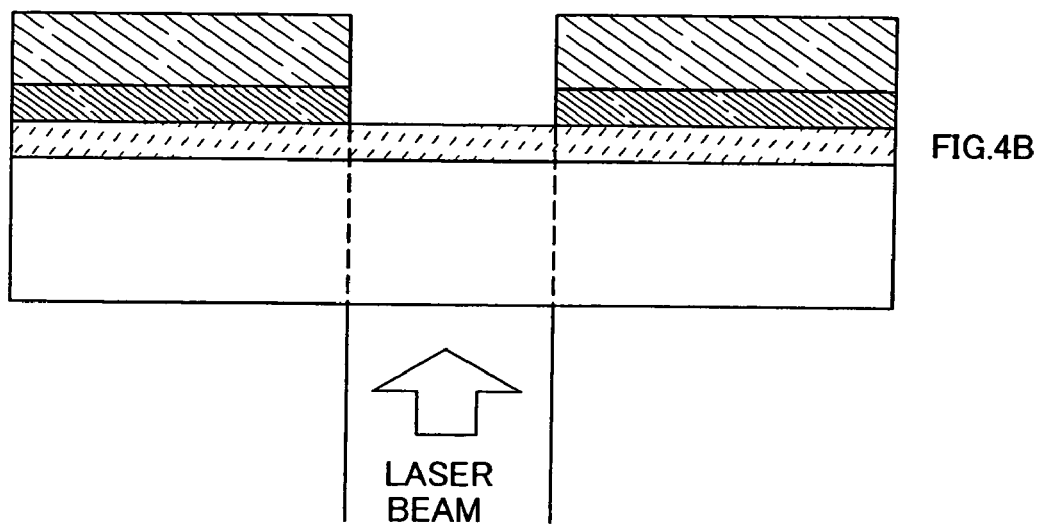
Figure 4C:
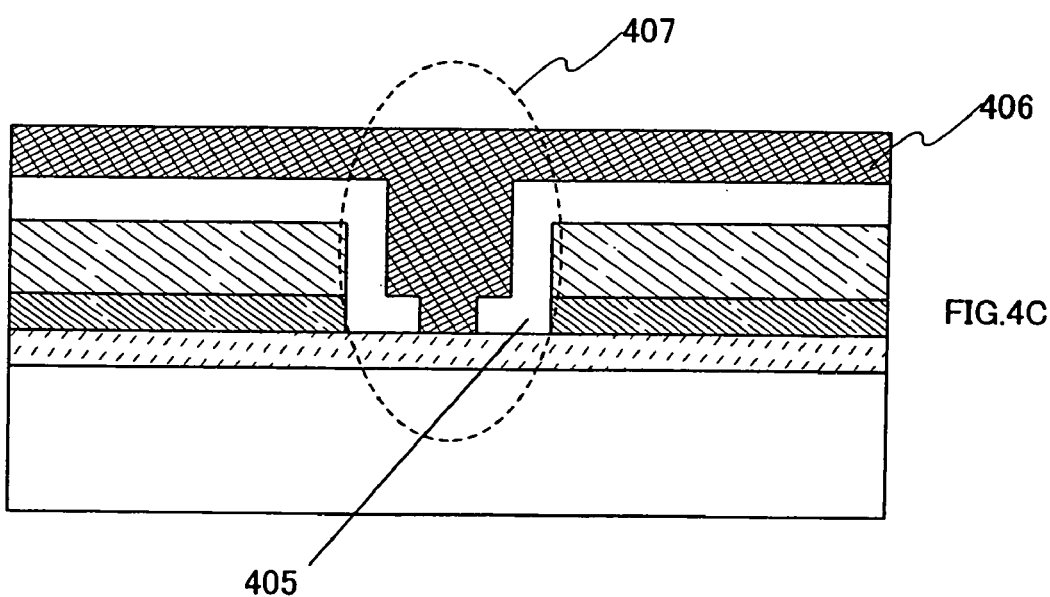

This embodiment describes a method for manufacturing the lighting system according to the present invention illustrated in FIGS. 1A and 1B, which differs from that of Embodiment 1, with reference to FIGS. 4A to 4C.

A transparent conductive film, which is a first electrode 402, is formed over a light-transmitting substrate 401. In this embodiment, a glass substrate is used as the light-transmitting substrate 401 and ITO is formed as the first electrode 402.

A layer containing a light-emitting substance 403 and a second electrode 404 are sequentially formed (FIG. 4A). In this embodiment, aluminum is formed for the second electrode 404.

Thereafter, an opening is formed by delivering a laser beam to the light-transmitting substrate 401 side (FIG. 4B). A laser beam having a wavelength enough to be transmitted through the glass substrate and ITO and absorbed by the layer containing a light-emitting substance 403 and the second electrode 404, is used as the laser beam. In this embodiment, a laser beam having a 532 nm wavelength is used. The laser beam having a 532 nm wavelength can be obtained by converting a fundamental wave (1064 nm wavelength) of a YAG laser, a $YVO_4$ laser, or the like into the second harmonic by a nonlinear optical element. After absorbing the laser beam, the layer containing a light-emitting substance and the second electrode are heated and sublimated, thereby forming the opening. After forming the opening, an insulating film 405 and an auxiliary electrode 406 are formed in the same manner as Embodiment 1 so that the first electrode 402 is electrically connected to the auxiliary electrode 406 through an opening 407 (FIG. 4C).

Embodiment 3

This embodiment describes a method for manufacturing the lighting system according to the present invention illustrated in FIGS. 5A and 5B with reference to FIGS. 6A to 6C and FIGS. 7A and 7B.

Figure 6A:
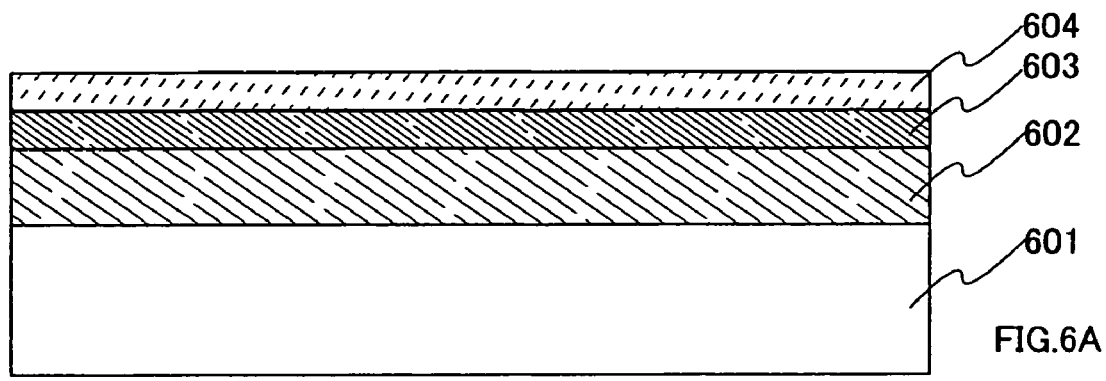
FIGS. 6A to 6C each illustrate a method for manufacturing a lighting system according to a certain aspect of the present invention.

A second electrode 602, a layer containing light-emitting substance 603, and a first electrode 604 are formed over a thin substrate 601 formed of a flexible material. In this embodiment, aluminum is formed as the second electrode 602 and ITO is formed as the first electrode 604 over a polyester film (FIG. 6A).

Figure 6B:
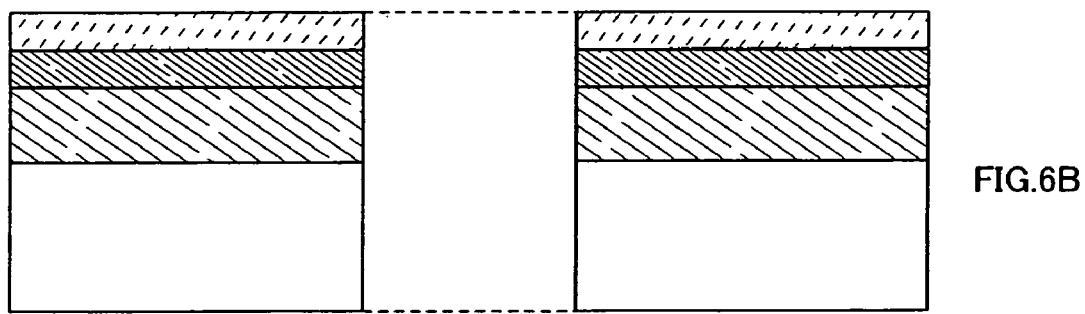

Then, the substrate 601, the second electrode 602, the layer containing a light-emitting substance 603, and the first electrode 604 are provided with an opening (FIG. 6B). Since the substrate 601 is formed of a flexible material, the opening can be easily formed by applying physical strength.

Figure 6C:
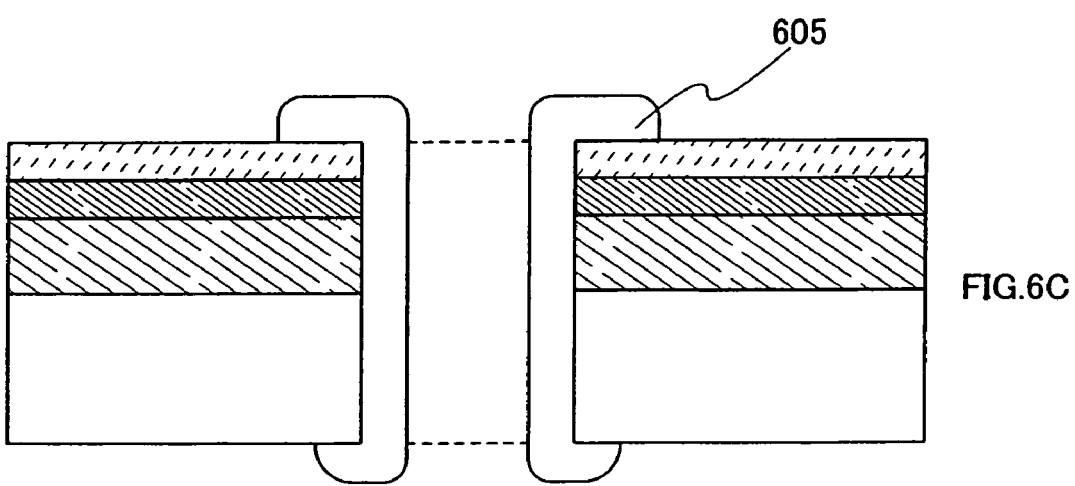

A silicon oxide film is formed as an insulating film 605. The silicon oxide film is formed using a mask by a sputtering method or a vapor deposition method (FIG. 6C). The silicon oxide film is formed to wrap around to the opposite surface of an intended surface through the opening by using a sputtering method or a vapor deposition method. According to this, the second electrode 602 is more certainly insulated from an auxiliary electrode 606.

Figure 7A:
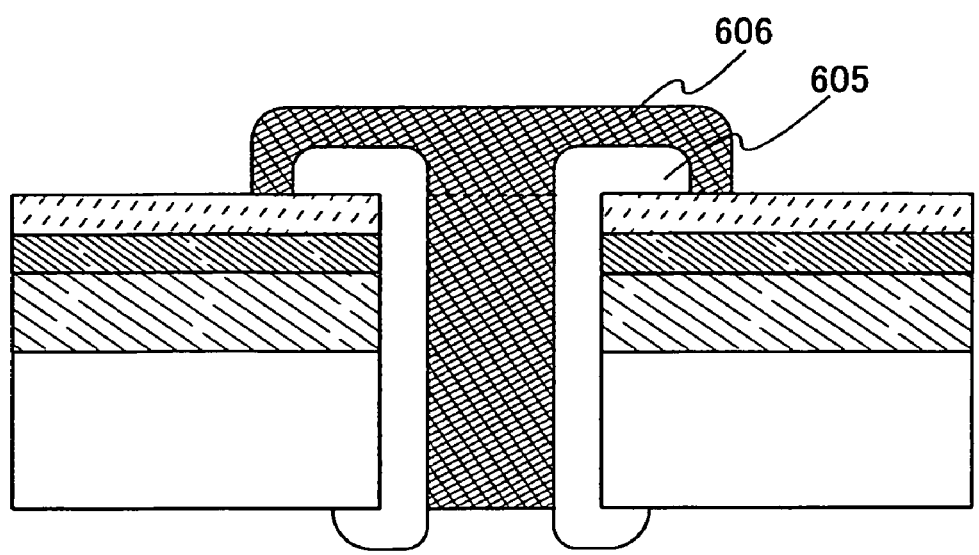
FIGS. 7A and 7B each illustrate a method for manufacturing a lighting system according to a certain aspect of the present invention.
Figure 7B:
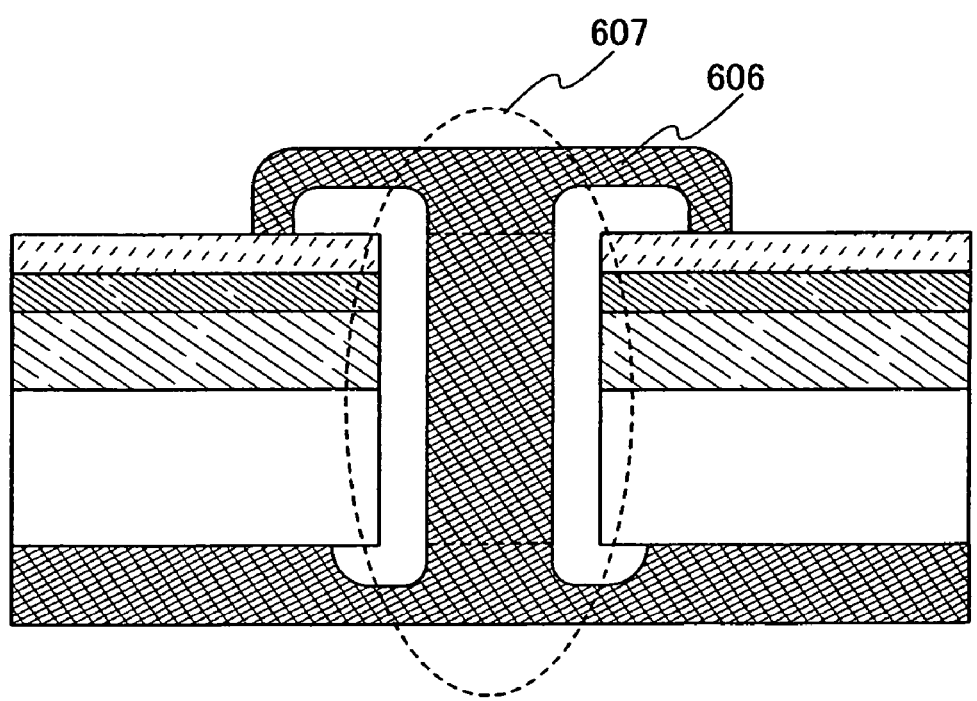

Then, the auxiliary electrode 606 is formed. First, silver is formed on the first electrode 604 side by a printing method. At this time, an opening 607 is filled with silver by using a printing method (FIG. 7A). Next, the silver is entirely formed on the substrate 601 side (FIG. 7B). Accordingly, the first electrode 604 is electrically connected to the auxiliary electrode 606. Thus, an effect of voltage drop due to relatively high resistivity of the first electrode can be reduced. Therefore, a lighting system having favorable in-plane uniformity of luminance can be obtained when the lighting system is applied to a large-sized lighting system.

In the structure of this embodiment, ITO, which is the first electrode, is connected to silver, which is the auxiliary electrode in the direction of light emission. However, in the case where the opening 607 is sufficiently small, the presence of the auxiliary electrode can be substantially disregarded when the lighting system is seen from the side of light emission, in other words, from the side of the first electrode.

Embodiment 4

This embodiment describes an example of an overall structure of the lighting system according to the present invention with reference to FIGS. 8A and 8B.

FIGS. 8A and 8B are a top view and cross-sectional view of the lighting system of the invention, respectively. The lighting system of the invention includes a substrate 801, a first electrode 802, a layer containing a light-emitting substance 803, a second electrode 804, an insulating film 805, and an auxiliary electrode 806. The first electrode 802 is electrically connected to the auxiliary electrode 806 through an opening 807. A light-emitting region is provided with a plurality of openings 807. In addition, a second insulating film 808 is formed at the end of the luminescence region, which prevents the first electrode 802 and the second electrode 804 from shorting. Current supply terminals 809 are each connected to the second electrode 804 and the auxiliary electrode 806. Then, the light-emitting region is sealed with a sealant 810. The sealant is desirable to be a material which transmits as little moisture and oxygen as possible to prevent deterioration of the layer containing a light-emitting substance. In addition, the inside surrounded by the sealant is filled with a filler 811. An inert gas (nitrogen, argon, or the like) may be filled instead of the filler in the inside surrounded by the sealant. The same material as the sealant may be filled.

Although FIGS. 8A and 8B each exemplify the structure described in Embodiment 1, the structure described in Embodiment 2 and Embodiment 3 can also be employed as a lighting system by sealing in the same manner.

Embodiment 5

This embodiment describes an example of a device using the lighting system according to the present invention with reference to FIG. 9 and FIGS. 10A to 10C.

Figure 9:
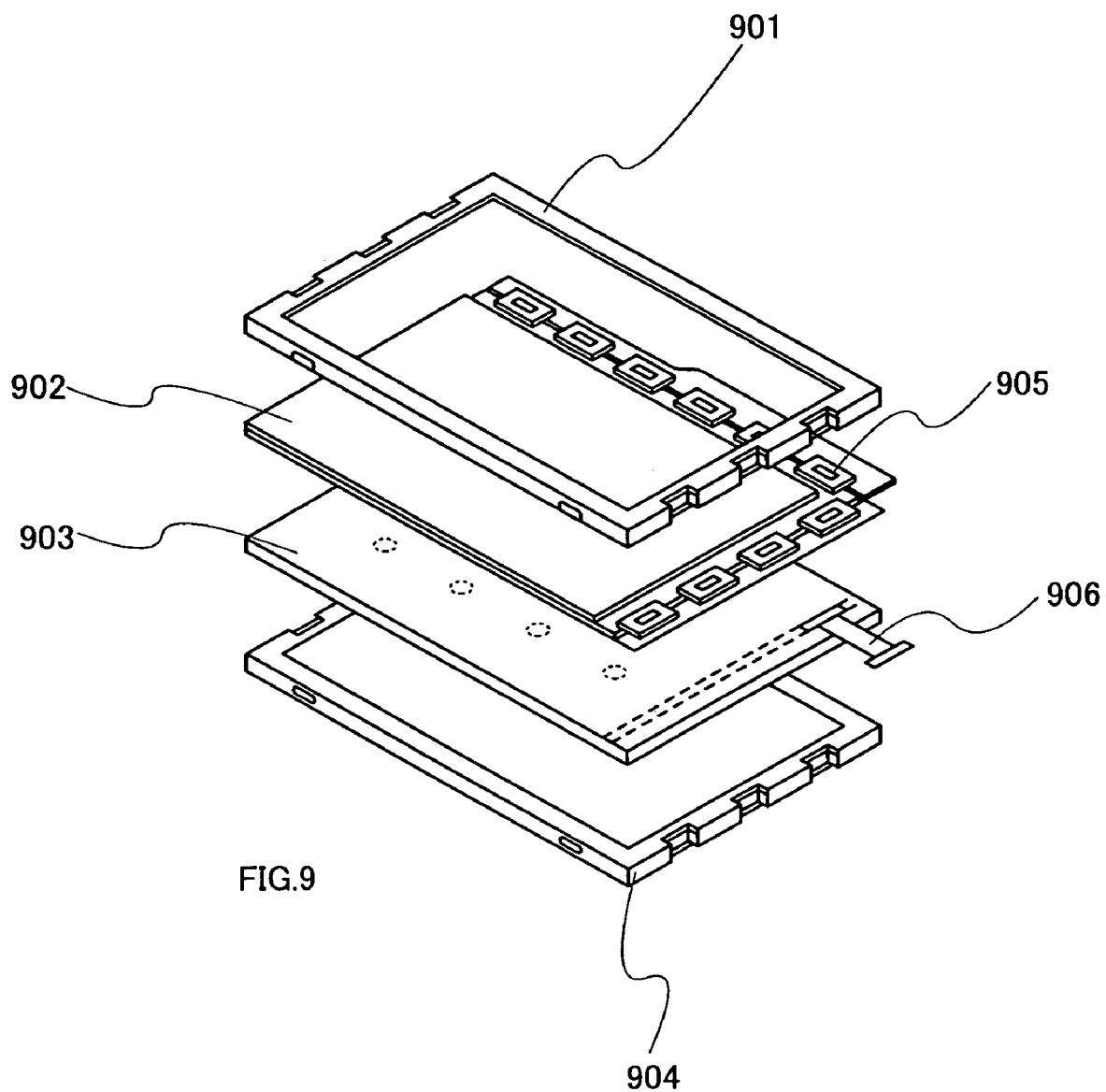
FIG. 9 illustrates an example of a device using a lighting system according to a certain aspect of the present invention.

FIG. 9 is an example of a liquid crystal display device using the lighting system of the invention as a backlight. The liquid crystal display device illustrated in FIG. 9 includes a casing 901, a liquid crystal layer 902, a backlight 903, and a casing 904. The liquid crystal layer 902 is connected to a driver IC 905. In addition, the lighting system of the invention is used as the backlight 903 and current is supplied through a terminal 906.

A backlight having favorable in-plane uniformity of luminance can be obtained by using the lighting system of the invention as a backlight of a liquid crystal display device; therefore, the quality of the liquid crystal display device is enhanced. Since the backlight can have large area, the liquid crystal display device can also have large area. Further, the light-emitting element is thin and consumes less power; therefore, the liquid crystal display device can also be thinned and made to consume less power.

Figure 10A:
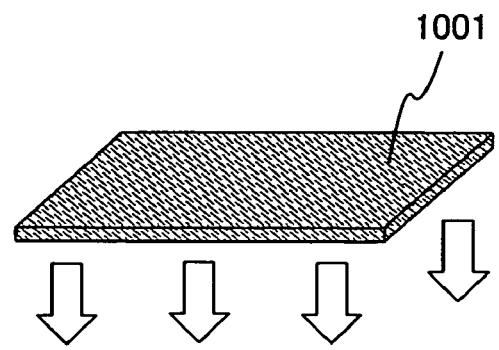
FIGS. 10A to 10C each illustrate an example of a device using a lighting system according to a certain aspect of the present invention.

FIG. 10A is an example of using the lighting system of the invention as indoor lighting. The lighting system of the invention is a surface-emitting lighting system and has favorable in-plane uniformity of luminance even when it has large area. Therefore, an entire ceiling, for example, can be provided with the lighting system of the invention. Not only the ceiling but also a wall, a floor, a column, or the like can be provided with the lighting system of the invention. Further, since the lighting system of the invention is flexible, the lighting system can be provided on a curved surface. Furthermore, the lighting system can be used not only indoors but also outdoors and can be provided on a building wall or the like as outdoor light.

Figure 10B:
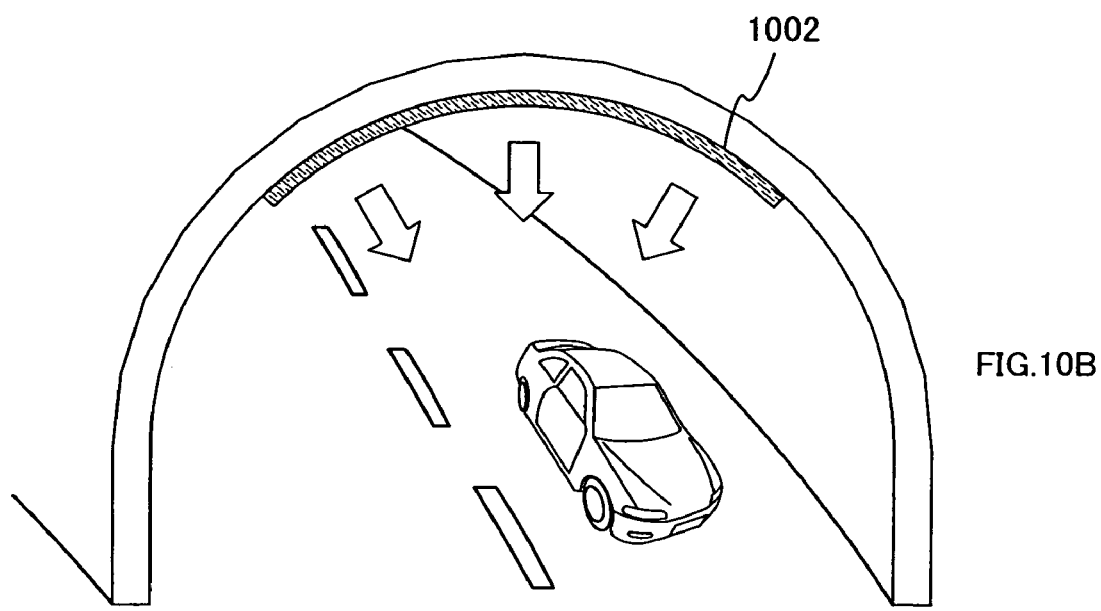

FIG. 10B is an example of using the lighting system of the invention as lighting in a tunnel. Since the lighting system of the invention is flexible, the lighting system can be formed along a curved inner wall of a tunnel.

Figure 10C:
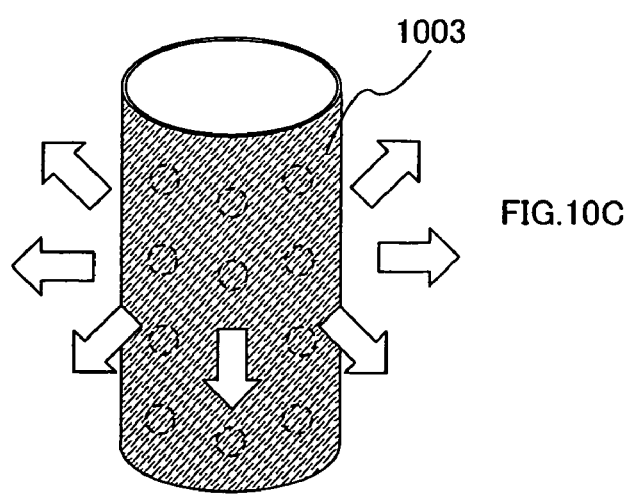

FIG. 10C is an example of using the lighting system of the invention as interior lighting. Since the lighting system of the invention is thin and flexible and is a surface-emitting type, it can be processed into a desired shape as illustrated in FIG. 10B.

In addition, the lighting system of the invention can also be used for lighting in taking a picture. When the picture is taken, a picture similar to the one taken with a subject illuminated by natural light can be taken when a subject is illuminated by large-sized light with uniform luminance.

The present application is based on Japanese Patent Application serial no. 2004-166041 filed on Jun. 3, 2004 with the Japanese Patent Office, the entire contents of which are hereby incorporated by reference.

What is claimed is:

1. A liquid crystal display comprising;
a liquid crystal layer;
a first electrode formed over a substrate,
a second electrode,
a layer containing a light-emitting substance provided between the first electrode and the second electrode,
an insulating layer which is formed over the first electrode in a grid form and contains a fluorescence substance, and
a wiring,
wherein the insulating layer includes a depression portion and an opening provided in the depression portion,
wherein the wiring is provided in the depression portion of the insulating layer and is connected to the first electrode through the opening and to the layer containing the light-emitting substance,
wherein the wiring is in contact with the layer containing the light-emitting substance,
wherein a bottom surface of the insulating layer is in contact with only a top surface of the first electrode, and
wherein the insulating layer is formed only over the first electrode.

2. A display according to claim 1,
wherein the first electrode comprises a transparent conductive film.

3. A display according to claim 1,
wherein the first electrode comprises a material selected from the group consisting of indium tin oxide, indium tin oxide containing silicon, and indium oxide containing zinc oxide.

4. A display according to claim 1,
wherein the layer containing the light-emitting substance comprises a material selected from the group consisting of organic compound and inorganic compound.

5. A display according to claim 1,
wherein the insulating layer comprises a material selected from the group consisting of siloxane, acrylic and polyimide.
6. A display according to claim 1,
wherein the wiring comprises a material selected from the group consisting of aluminum and copper.
7. A display according to claim 1,
wherein the first electrode, the insulating layer, and the wiring are covered with the layer containing the light-emitting substance.
8. A lighting system comprising:
a first electrode formed over a substrate,
a second electrode,
a layer containing a light-emitting substance provided between the first electrode and the second electrode,
an insulating layer which is formed over the first electrode in a grid form and contains a fluorescence substance, and
a wiring,
wherein the insulating layer includes a depression portion and an opening provided for the depression portion,
wherein the wiring is provided in the depression portion of the insulating layer and is connected to the first electrode through the opening and to the layer containing the light-emitting substance,
wherein the wiring is in contact with the layer containing the light-emitting substance,
wherein a bottom surface of the insulating layer is in contact with only a top surface of the first electrode, and
wherein the insulating layer is formed only over the first electrode.
9. A liquid crystal display comprising:
a liquid crystal layer;
a substrate;
a first electrode provided over the substrate;
an insulating layer having a depression and an opening and provided over the first electrode;
a layer containing a light-emitting substance;
a wiring provided in the depression and connected to the first electrode through the opening and to the layer containing the light-emitting substance; and
a second electrode provided over the layer containing the light-emitting substance
wherein the first electrode, the insulating layer, and the wiring are covered with the layer containing the light-emitting substance,
wherein the wiring is in contact with the layer containing the light-emitting substance,
wherein a bottom surface of the insulating layer is in contact with only a top surface of the first electrode, and
wherein the insulating layer is formed only over the first electrode wherein the insulating layer comprises a fluorescent substance.
10. A lighting system comprising:
a substrate;
a first electrode provided over the substrate;
an insulating layer having a depression and an opening and provided over the first electrode;
a layer containing a light-emitting substance;
a wiring provided in the depression and connected to the first electrode though the opening and to the layer containing the light-emitting substance; and
a second electrode provided over the layer containing the light-emitting substance,
wherein the first electrode, the insulating layer, and the wiring are covered with the layer containing the light-emitting substance,
wherein the wiring is in contact with the layer containing the light-emitting substance,
wherein a bottom surface of the insulating layer is in contact with only a top surface of the first electrode,
wherein the insulating layer is formed only over the first electrode wherein the insulating layer comprises a fluorescent substance.
11. A lighting system according to claim 8,
wherein the opening penetrates the insulating layer from a substrate side to a side which is opposite to the substrate.
12. A liquid crystal display according to claim 9,
wherein the opening penetrates the insulating layer from a substrate side to a side which is opposite to the substrate.
13. A lighting system according to claim 10,
wherein the opening penetrates the insulating layer from a substrate side to a side which is opposite to the substrate.
14. A liquid crystal display according to claim 1,
wherein the entirety of the bottom surface of the insulating layer is in contact with the top surface of the first electrode.
15. A lighting system according to claim 8,
wherein the entirety of the bottom surface of the insulating layer is in contact with the top surface of the first electrode.
16. A liquid crystal display according to claim 9,
wherein the entirety of the bottom surface of the insulating layer is in contact with the top surface of the first electrode.
17. A lighting system according to claim 10,
wherein the entirety of the bottom surface of the insulating layer is in contact with the top surface of the first electrode.

* * * * *

UNITED STATES PATENT AND TRADEMARK OFFICE
CERTIFICATE OF CORRECTION

PATENT NO. : 7,733,441 B2  Page 1 of 1
APPLICATION NO. : 11/139673
DATED : June 8, 2010
INVENTOR(S) : Satoshi Seo It is certified that error appears in the above-identified patent and that said Letters Patent is hereby corrected as shown below:

Column 5, line 36, replace "ABIX" with --ABTX--;

Column 10, lines 36-37, replace "coumarin115" with --coumarin151--;

Column 18, line 11, in claim 10 replace "though" with --through--.

Signed and Sealed this

Seventeenth Day of August, 2010

David J. Kappos
*Director of the United States Patent and Trademark Office*